United States Patent
Palasyuk et al.

(10) Patent No.: US 11,649,537 B2
(45) Date of Patent: May 16, 2023

(54) PERMANENT MAGNET ALLOYS FOR GAP MAGNETS

(71) Applicant: Iowa State University Research Foundation, Inc., Ames, IA (US)

(72) Inventors: Andriy Palasyuk, Ames, IA (US); Tej Nath Lamichhane, Ames, IA (US); Olena Palasyuk, Ames, IA (US); Vladimir Antropov, Ames, IA (US); Paul C. Canfield, Ames, IA (US); Ralph W. McCallum, Santa Fe, NM (US)

(73) Assignee: Iowa State University Research Foundation, Inc., Ames, IA (US)

( * ) Notice: Subject to any disclaimer, the term of this patent is extended or adjusted under 35 U.S.C. 154(b) by 109 days.

(21) Appl. No.: 16/350,612

(22) Filed: Dec. 10, 2018

(65) Prior Publication Data

US 2019/0185980 A1      Jun. 20, 2019

Related U.S. Application Data

(60) Provisional application No. 62/708,546, filed on Dec. 12, 2017.

(51) Int. Cl.
| | | |
|---|---|---|
| *C22C 19/07* | (2006.01) | |
| *C22F 1/10* | (2006.01) | |
| *H01F 1/047* | (2006.01) | |
| *C30B 29/52* | (2006.01) | |
| *H01F 1/055* | (2006.01) | |

(52) U.S. Cl.
CPC ............. *C22F 1/10* (2013.01); *C22C 19/07* (2013.01); *C30B 29/52* (2013.01); *H01F 1/047* (2013.01); *H01F 1/055* (2013.01); *C22C 2202/02* (2013.01)

(58) Field of Classification Search
CPC ....... C22C 19/07; C22C 2202/02; C22F 1/10; C30B 1/02; H01F 1/047; H01F 1/055
See application file for complete search history.

(56) References Cited

U.S. PATENT DOCUMENTS

| | | | |
|---|---|---|---|
| 4,047,982 A * | 9/1977 | Sagawa ................... | H01F 1/055 148/101 |
| 2015/0147228 A1* | 5/2015 | Endo ....................... | H01F 1/055 420/582 |
| 2015/0270040 A1* | 9/2015 | Horiuchi ................. | H01F 1/0557 310/152 |

FOREIGN PATENT DOCUMENTS

JP         S5496421      *  7/1979

OTHER PUBLICATIONS

M.P. Arbuzov et al, Magnetic properties of sintered (C,Cu,Fe)5Ce alloys, Poroshkovaya Metalurgiya, 9, 85, 1977.
Koichiro Inomata et al, Sintered Ce—Co—Cu—Fe—Ti magnets, Applied Physics Letters, 30, 669-670, 1977.
Yoshio Tawara et al, Permanent magnets based on (Ce,Sm)(Co,Fe,Cu)z, Applied Physics letters, 33, 674-675, 1978.

(Continued)

*Primary Examiner* — Nicholas A Wang

(57) ABSTRACT

Provided are Ce/Co/Cu permanent magnet alloys containing certain refractory metals, such as Ta and/or Hf, and optionally Fe which represent economically more favorable alternative to Sm-based magnets with respect to both material and processing costs and which retain and/or improve magnetic characteristics useful for GAP MAGNET applications.

18 Claims, 27 Drawing Sheets

(56) References Cited

OTHER PUBLICATIONS

B. Labulle et al, X-ray study of monocrystalline alloys near the composition CeCo3.5Cu1.5, Journal of the Less Common Metals, 66, 183-200, 1979.

B. Labulle et al, Oxidation study of monocrystalline CeCo5—xCux by x-ray diffraction methods, Journal of the Less Common Metals, 71, 183-194, 1980.

D. Giordin et al, Phase equlibria in the CeCo5—CeCu5 system and structural characteristics of the Ce (Co1—xCux) 5 phases, Journal of the Less Common Metals, 110, 149-158, 1985.

Karl J. Strant et al, Rare earth-cobalt permanent magnets, Journal of Magnetism and Magnetic Materials, 100, 38-56, 1991.

H. Senno et al, Permanent-magnet properties of Sm—Ce—Co—Fe—Cu alloys with compositions between 1-5 and 2-17, IEEE Transactions, on Magnetics, 10, 313-317, 1974.

M. J. Kramer et al, Prospects for non-rare earth permanent magnets for tractin motors and generators, JOM, 64, 752-763, 2012.

Tej N. Lamichhane et al, Ce3—xMgxCo9: Tranformation of a pauli paramagnet into a strong permanent magnet, Physical Review Applied, 9, 2018.

K.H.J. Buschow et al, The crystal structures of the rare-earth compounds R2N17, R2CO17, and R2Fe17, Journal of the Less Common Metals, 11 204-208, 1966.

Chen Zhou et al, Formation of TbCu7-type CeFe10Zro.8 by rapid solidification, Journal of Alloys and Compounds, 569, 6-8,2013.

Lars Nordstrum et al, Theory of ferromagnetism in CeCo5, Physical Review, B 41, 9111-9120, 1990.

Standard specifications for permanent magnet materials, mmpa standard n 0100-00, 1964.

K.H.J. Buschow et al, Composition and crystal structure of hexagonal Cu-rich rare earth-copper compounds, Acta Crystallographica Section B, Sturcural Crystallogrpahy and Crystal Chemistry, 27, 10-85-1088, 1971.

M.I. Bartashevich et al, Magnetic anisotropy and high field magnetization process of CeCo5, Journal of Magnetism and Magnetic Materials, 131, 61-66, 1994.

W. Sucksmith et al, The magnetic anisotropy of cobalt, Proceedings of the Royal Society of London, A Mathematical, Physical Engineering Sciences, 225, 362-375, 1954.

H. Okamoto et al, Alloy Phase Diagrams, vol. 3, ASM Handbook, 1990.

Manh Cuong Nguyen et al, Magnetocrystalline anisotropy in cobalt based magnets: a choice of correlation parameters and the relativistic effects, J. Phys.: Condens Matter, 30, 2018.

P.C. Canfield et al, Growth of single crystals from metallic fluxes, Philosophical Magazine B, vol. 65, No. 6, pp. 1117-1123, 1992.

Paul C. Canfield et al, High-temperature solution growth of intermetallic single crystals and quasicrystals, Journal of Crystal Growth, 225, pp. 155-161, 2001.

G. Chin et al, Directional solidifcation of Ce—Cu—R permanent magnet alloys, IEEE Transactions on Magnetics, 8, 29-35,1972.

E.A. Nesbitt et al, Intrinsic magnetic properties and mechanism of magnetization of Co—Cu—Fe—R permanent magnets, AIP Conference Proceedings, AIP 1973.

H. Okamoto et al, Ce—Co Phase Diagrams, ASM Alloy Phase Diagrams Data Base, 1990.

E.A. Nesbitt, New permanent magnet materials containing rare-earth metals, Journal of Applied Physics, 40, 1259-1265, 1969.

E.A. Nesbitt et al, New Permanent Magnet Materials, Applied Physics Letters, 12, 361-363, 1968.

Yoshio Tawara et al, Cerium, cobalt and copper alloy as permanent magnet material, Japanese Journal of Applied Physics, 7, 966-967, 1968.

J.M.D. Coey, Permanent magnet: Plugging the gap, Scripta Materiala, 67, 524-529, 2012.

Harufumi Sereno et al, Microstructure of a cerium, cobalt and copper alloy with high coercivity, Japanese Journal of Applied Physics, 8, 118, 1969.

E.A. Nesbitt et al, Effect of procssing on permanent magnet materials containing rare-earth metals, Journal of Applied Physics, 40, 4006-4009, 1969.

Thomas J. Cullen, Cast permanent magnets of cobalt, copper, and cerium: Process and performance characteristics, 1536, 1971.

R.C. Sherwood et al, Preparation and properties of sintered CoCuFeCe permanent magnets, Materials Research Bulletin 7, 489-493, 1972.

Y. Tawara et al, Sintered magnets of copper- and iron-modified cerium, cobalt, IEEE Transactions on Magnetics, 8, 56o-561, 1972.

H. Leamy et al, The structure of Co—Cu—Fe—Ce permanent magnets IEEE Transactions on Magnetics, 9, 205-209, 1973.

Y. Khan, Intermetallic compounds in the cobalt-rich part of the R-cobalt systems (R = Ce, La, Ce/La), Journal of Less Common Metals, 34, 191-200, 1974.

M.P. Arbuzov et al, Coercive force of cast and sintered permanent magnets in Co—Cu—Fe—Ce alloys, Poroshkovaya Metalurgiya, 9, 48, 1974.

M.P. Arbuzov et al, X-ray diffraction analysis of the phase composition of the alloy Co4CuCe1.02, Fiz. Metal. Metalloved, 40, 848, 1975.

M.P. Arbuzov et al, Crystal structure and coercive force of sintered permanents magnets in alloys of the system Co—Cu—Fe—Ce, Poroshkovaya Metalurgiya, 5, 97, 1975.

E. Nesbitt et al, Influence of cerium content on the structure and magnetic behavior of Co—Fe—Cu—Ce permanent magnets, IEEE Transactions on Magnetics, 9, 203-205, 1973.

M.P. Arbuzov et al, Magnetic characteristics of sintered permanent magnets in (Co, Cu,Fe)5Ce alloys, Poroshkovaya Metalugiya, 7, 56, 1977.

M.P. Arbuzov et al, Magnetic characteristics of sintered permanent magnets in alloys of the Co Cu Fe Ce system, Poroshkovaya Metalurgiya, 8, 69, 1977.

\* cited by examiner

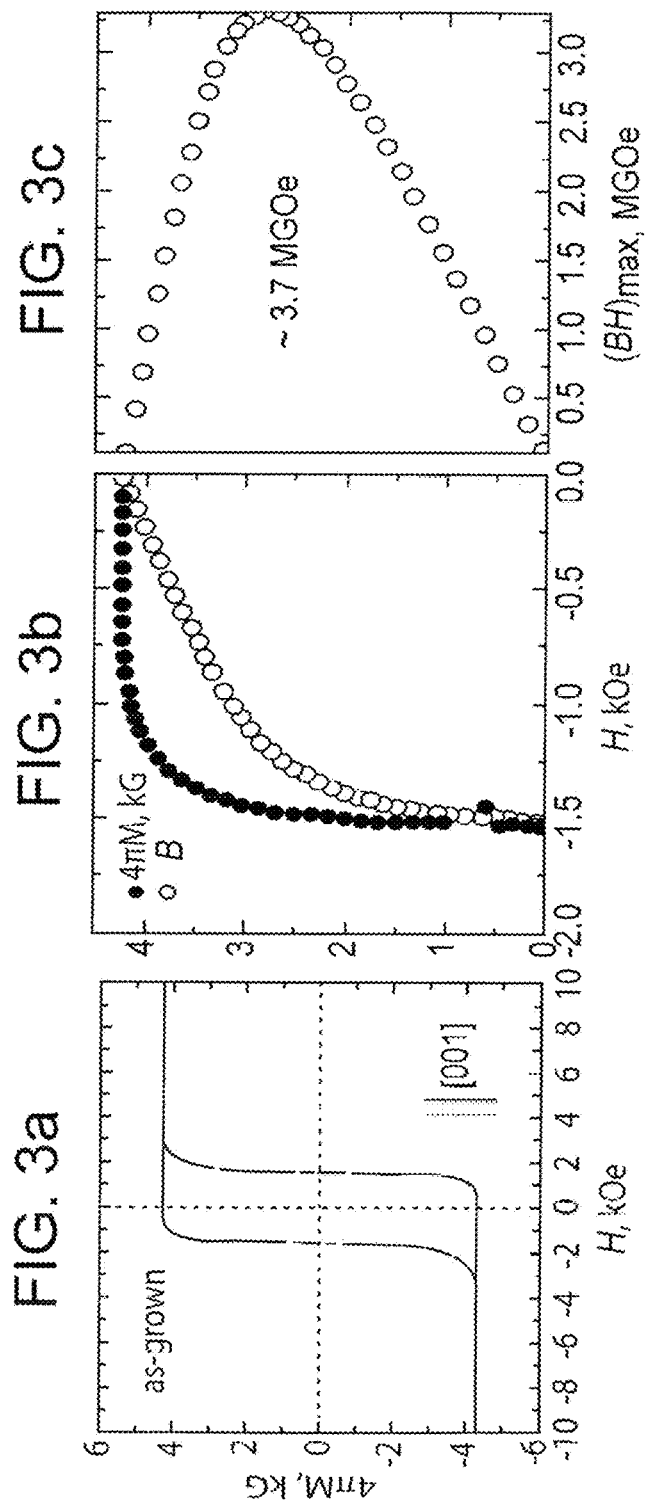

(a)

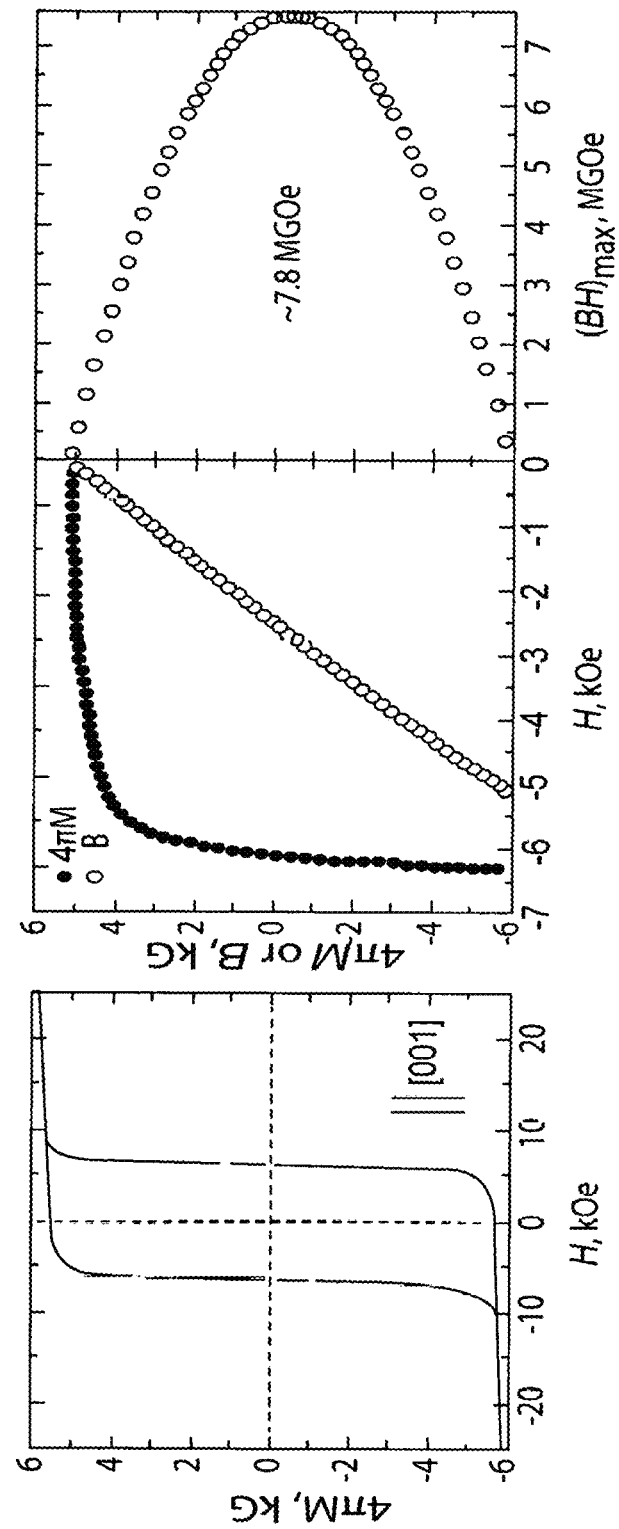

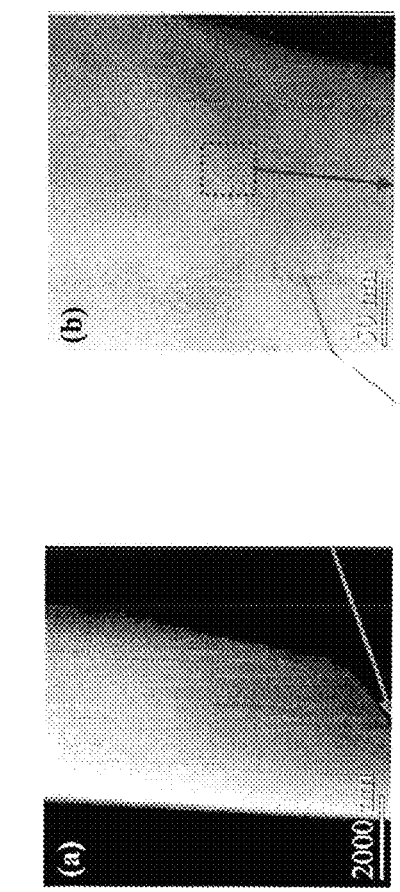
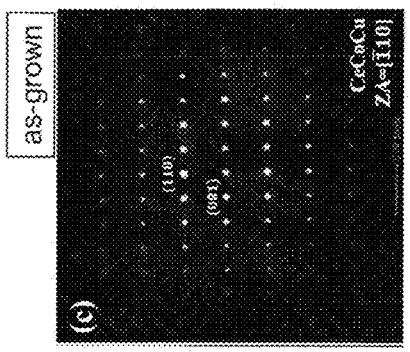
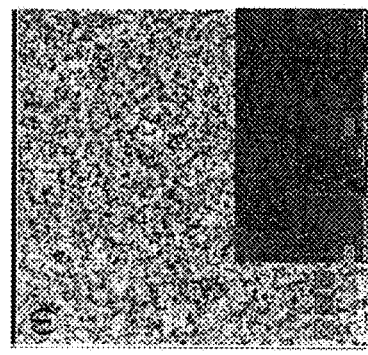
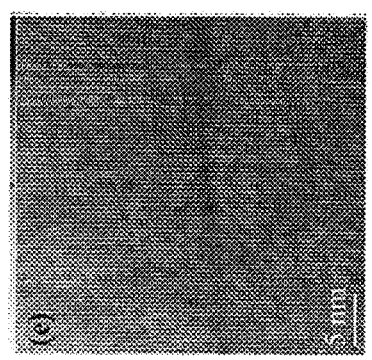
FIG. 14a  FIG. 14b  FIG. 14c  FIG. 14d  FIG. 14e  FIG. 14f

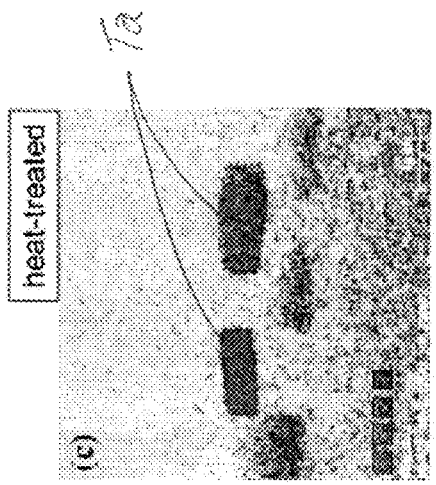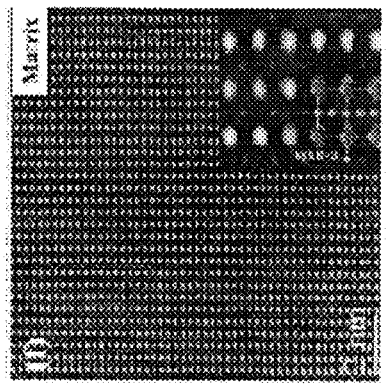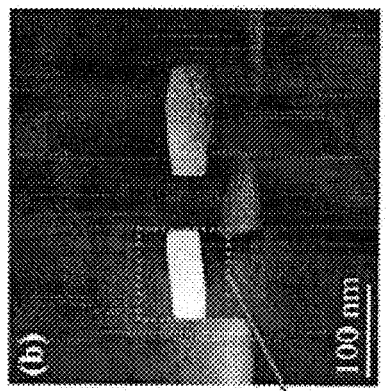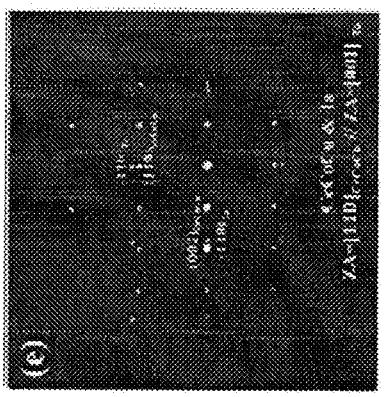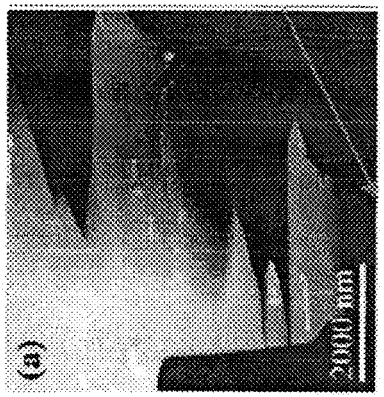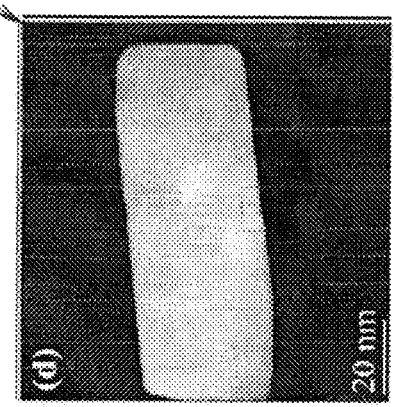
FIG. 15a  FIG. 15b  FIG. 15c
FIG. 15d  FIG. 15e  FIG. 15f Table 8

| Spectrum Label | 02 | 03 | 04 | 01 | 051 | 052 | 053 |
|---|---|---|---|---|---|---|---|
| Fe | 12.10 | 11.94 | 12.14 | 12.15 | 10.58 | 10.55 | 12.74 |
| Co | 62.06 | 61.32 | 61.75 | 62.01 | 63.15 | 62.62 | 60.74 |
| Cu | 10.19 | 10.83 | 10.37 | 10.32 | 7.20 | 6.90 | 8.61 |
| Ce | 14.88 | 15.17 | 14.93 | 14.88 | 13.49 | 12.89 | 12.03 |
| Hf | 0.77 | 0.74 | 0.80 | 0.64 | 5.57 | 7.04 | 5.87 |
| Total | 100.00 | 100.00 | 100.00 | 100.00 | 100.00 | 100.00 | 100.00 |

FIG. 23c

PERMANENT MAGNET ALLOYS FOR GAP MAGNETS

RELATED APPLICATION

This application claims benefit and priority of provisional application Ser. No. 62/708,546 filed Dec. 12, 2017, the entire disclosure and drawings of which are incorporated herein by reference.

CONTRACTUAL ORIGIN OF THE INVENTION

This invention was made with government support under Grant No. DE-AC02-07CH11358 awarded by the Department of Energy. The Government has certain rights in the invention.

FIELD OF THE INVENTION

The present invention relates to permanent magnet alloys and to permanent magnets made from the alloys.

BACKGROUND OF THE INVENTION

There now exists a "GAP" (an empty niche of magnetic energy products) between present-day low-flux (ferrites, Alnico) and high-flux ($Nd_2Fe_{14}B$-type and $SmCo_5$-type) magnets.

For example, there is interest in so-called "GAP MAGNETS" that reach energy products of about 10-20 MGOe and that would be both advantageous with respect to the cost of constituents and their fabrication into permanent magnets as well as reliable in performing successfully within the "GAP" which exists between present-day low-flux (ferrites, alnico) and high-flux ($Nd_2Fe_{14}B$- and $SmCo_5$-type) magnets.

Despite previous extensive explorations, the intrinsic properties of the $CeCo_5$-type systems have not been fully or systematically established, and the metallurgy related to the magnetic pinning/coercivity mechanism is not fully understood. Although anisotropy characterization is best obtained from single crystals, single crystal growth reports in Cu or Fe substituted $CeCo_5$ systems are scarce and limited to several Bridgeman type attempts [see G. Chin, et al., "Directional solidification of Co—Cu—R permanent-magnet alloys," IEEE Transactions on Magnetics 8, 29-35 (1972) and see E. A. Nesbitt, et al. "Intrinsic magnetic properties and mechanism of magnetization of Co—Fe—Cu—R permanent magnets," in *AIP Conference Proceedings* (AIP, 1973)] in the vicinity of the composition about $CeCo_{3.5}Fe_{0.5}Cu$ [see H. Okamoto, "Ce—Co Phase Diagram, ASM Alloy Phase Diagrams Database, P. Villars, editor-in-chief; H. Okamoto and K. Cenzual, section editors," 1990].

SUMMARY OF THE INVENTION

The present invention provides permanent magnet alloys comprising Ce, Co, and Cu also containing one or more of certain refractory metals (e.g. one or more of Ta, Hf, Zr, Nb, Mo, and W) and optionally Fe which represent economically more favorable alternative to Sm-based magnets with respect to both material and processing costs and can retain and/or provide improved magnetic characteristics. The magnet alloys are useful for making so-called "GAP MAGNETS".

The present invention envisions substitution of more than 50% of critical rare-earth elements, i.e., Sm, Dy, Nd etc, in the commercial high-flux permanent $RCo_5$ magnets by cheaper, more abundant and non-critical Ce. This will significantly reduce costs of material, whereas the performance of such magnet must clearly surpass the levels of known commercial non-rare earth grades, and/or may reach the characteristics of the best rare-earth containing representatives.

The present invention envisions a "GAP MAGNET" that utilizes widely available and inexpensive Ce as more affordable alternative to critical rare-earths, making the magnet significantly cheaper and less supply dependent, and yet successfully performing in the range of 10-20 MGOe; i.e., within the "GAP" (an empty niche of energy products) which exists between present-day low-flux (ferrites, alnico) and high-flux ($Nd_2Fe_{14}B$-type and $SmCo_5$-type) magnets.

In addition, the present invention envisions further reductions in material costs by a partial substitution of Co by Fe. The substitution Fe was observed to strongly improve both the Curie temperature and magnetization of the magnet at room temperature. This substitution will lower the heat treatment requirements, which consequently will facilitate simplification of manufacturing process, i.e., decreasing the number of processing stages and reducing energy consumption.

Still further, the present invention envisions heat treating the above permanent magnet alloys in a manner to develop a bi-modal microstructure having refractory metal-containing laminar precipitates accompanied with nearby Cu-enriched and Co-depleted regions in a microstructure matrix, which can be primarily a single crystal grain and wherein formation of the bimodal microstructure produces microstructural changes that contribute to dramatic improvement of magnetic properties after heat treatment.

These and other advantages of the present invention will become more readily apparent from the following detailed description taken with the following drawings.

BRIEF DESCRIPTION OF THE DRAWINGS

FIG. 3a shows magnetic hysteresis loop for as-grown single crystal of the EXAMPLE #1; i.e., $Ce_{15.5}Ta_{0.6}Co_{67.8}Cu_{16.1}$ alloy. FIG. 3b shows the demagnetization $4\pi M$ and B curves. FIG. 3c shows an estimation of the energy product $(BH)_{max}$.

1; i.e., $Ce_{15.5}Ta_{0.6}Co_{67.8}Cu_{16.1}$ alloy. FIGS. 5a-5d are backscattered electron images of the [001] surface with different magnifications showing bimodal laminar microstructure.

FIG. 8a shows magnetic hysteresis loop of the heat treated "COMPOSITE CRYSTAL" of EXAMPLE #1; i.e., $Ce_{15.5}Ta_{0.6}Co_{67.8}Cu_{16.1}$ alloy. FIG. 8b shows the demagnetization 4πM and B curves. FIG. 8c shows an estimation of the energy product $(BH)_{max}$.

(FIG. 13b)-sample IV—$Ce_{16.3}Ta_{0.3}Co_{61.7}Cu_{21.7}$; and (FIG. 13c)-sample V—$Ce_{14.3}Ta_{1.0}Co_{62.0}Fe_{12.3}Cu_{10.4}$, wherein the upper panels are before and the lower panels are after heat treatment. All images were taken at a magnification 5000× and 15 kV.

FIG. 14a is a HAADF STEM image of as-grown sample III—$Ce_{15.7}Ta_{0.6}Co_{67.8}Cu_{15.9}$ showing the overall microstructure. FIG. 14b is an enlarged HAADF image shows a dark contrast line. FIG. 14c is a diffraction pattern taken from the region shown m FIG. 14b including the matrix and the dark line. FIG. 14d is a high resolution STEM image taken from left boxed area in FIG. 14b under [1-10] zone axis. The inset at bottom right is an enlarged atomic image with atomic model of hexagonal 1:5 Ce/Co/Cu phase. The bright dots and dark dots in the images correspond to atomic columns of Ce and (Co, Cu) elements, respectively. FIG. 14e is an enlarged image of right boxed area in 14b and dark line in single crystalline phase is shown clearly. FIG. 14f shows EDS elemental mapping of FIG. 14e indicating Co enrichment in the line, the small Co and Cu elemental maps-insets are presented for contrasting observation of Cu depletion in the same line.

FIG. 15a is a HAADF image of the heat treated sample III showing the overall microstructure. FIG. 15b is an enlarged image of the circled area of FIG. 15a. FIG. 15c is an EDS elemental mapping corresponding to FIG. 15b wherein the bright regions are Ta-rich and considered as a Ta precipitate. FIG. 15d is an enlarged image of the boxed area of FIG. 15b. FIG. 15e is a diffraction pattern taken from FIG. 15d including the matrix and the Ta precipitate. FIG. 15f is a high resolution STEM image taken from the matrix in FIG. 15d under [1-0] zone axis. Scale bar is 2 nm.

FIG. 16b—Ta,Co,Ce, and Cu, FIG. 16c—Ta, FIG. 16d—Co, FIG. 16e—Ce, FIG. 16f—Cu. The white dashed lines indicate the same position in each image.

In FIG. 21, the upper-left inset shows dependence of the spontaneous magnetization $M_s$ vs. Cu concentration for the as-grown and heat treated crystals. The lower-right inset shows dependence of the coercivity $H_c$ vs. Cu concentration for the as-grown and heat-treated crystals.

FIG. 23c contains Table 8 which shows the elemental atomic fractions for target areas of matrix (0 1-0 4) and Hf-rich precipitates (0 5 1-0 5 3).

DETAILED DESCRIPTION OF THE INVENTION

The present invention provides Ce/Co/Cu permanent magnet alloys which contain one or more of certain refractory metals that can include at least one of Ta, Hf, Zr, Nb, Mo, and W, and optionally Fe and which can be heat treated to promote a bimodal microstructure having refractory metal-containing laminar precipitates accompanied with Cu-enriched and Co-depleted regions in the single crystal matrix microstructure. Such permanent magnet alloys comprise controlled amounts of Ce, Co, Cu and refractory metal, and optionally Fe. An illustrative embodiment of the invention involves a permanent magnet alloy that comprises, in atomic %, about 13 to about 17% Ce, about 38 to about 70% Co, about 10% to about 30 atomic % Cu, optionally about 10% to about 20% Fe, wherein the alloy includes at least one refractory metal in an individual amount or collective amount (if more than one refractory metal is present) greater than 0, such as at least about 0.1 up to about 3 atomic % of the alloy composition. Embodiments of the invention envision including two or more of the above refractory metals, such as for example both Ta and Hf, in the alloy composition to tailor microstructure and/or magnetic properties of the resulting magnet to particular applications.

A further illustrative embodiment of the invention involves a permanent magnet alloy comprising, in atomic %, about 14 to about 15.5% Ce, about 57.5 to about 62.0% Co, about 10% to about 16.5 atomic % Cu, about 10% to about 12.5% Fe, wherein the alloy includes at least one refractory metal in an individual amount or collective amount (if more than one refractory metal is present) of about 0.5 to about 1 atomic %. For example, when both Ta and Hf are present in the alloy, the collective amount thereof is about 0.5 to about 1 atomic %.

The magnet alloy is subjected to a series of particular solution heat treatments typically at solution temperatures 1000-1100° C. and aging procedures to develop a bimodal laminar microstructure. For purposes of illustration and not limitation, a series of heat treatments involve heating at solution temperatures of 1000-1100° C. (e.g. for 1-1.5 days) followed by aging at 400-450° C. (e.g. for 0.5-1 days). The heat treated alloy modified pursuant to the invention can deliver magnetic characteristics acceptable for the so-called "GAP MAGNET"; namely, $T_c$>300° C., $H_c$=0.5-1.0 T, $R_f$=4-8 kG and $(B)_{max}$=7-15 MGOe.

The present invention will be described below with respect to the following Examples that are offered for purposes of illustration and not limitation with respect to the scope of the invention.

EXAMPLES

This EXAMPLE #1 illustrates an initial experiment which resulted in realization of a Ce-substituted, Ta-doped $RCo_5$-type magnet pursuant to an illustrative embodiment of the invention which had a particular alloy composition represented by $Ce_{15.5}Ta_{0.6}Co_{67.8}Cu_{16.1}$.

Figure 1:
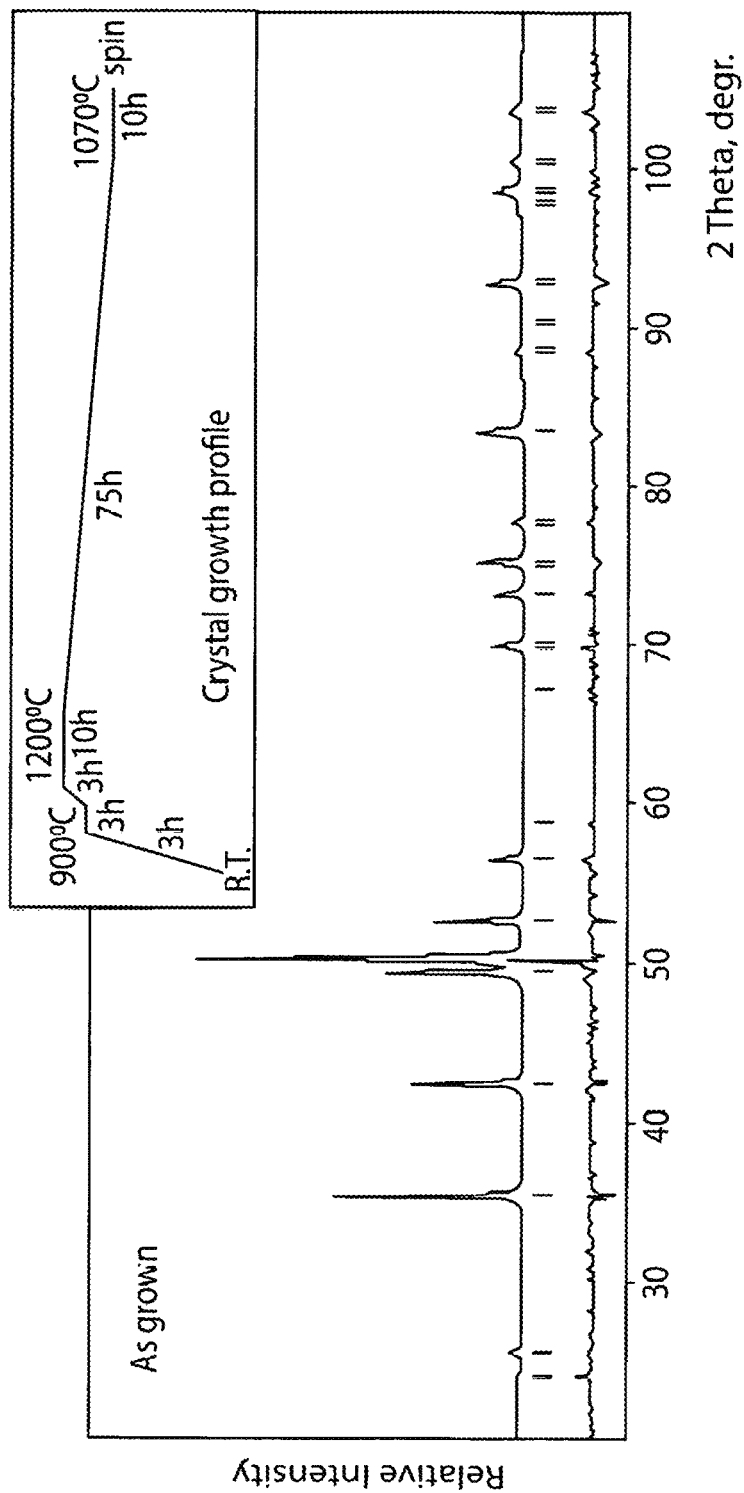
FIG. 1 shows PXRD pattern and Rietveld refinement results for EXAMPLE #1; i.e., $Ce_{15.5}Ta_{0.6}Co_{67.8}Cu_{16.1}$ (crushed and powdered single crystals). The observed profile is indicated by circles and the calculated profile by solid line. Bragg peak positions are indicated by vertical tics, and the difference is shown at the bottom. The insert of FIG. 1 shows the temperature-time profile of the flux growth.
Figure 2A:
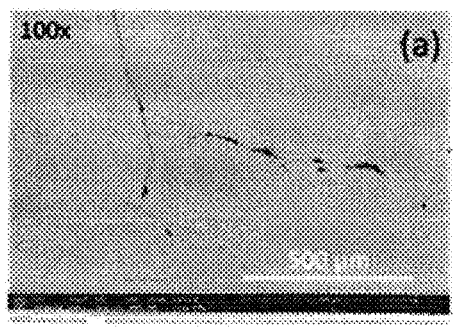
FIGS. 2a-2c show SEM analysis or as-grown single crystals of the EXAMPLE #1; i.e., $Ce_{15.5}Ta_{0.6}Co_{67.8}Cu_{16.1}$ alloy, which are backscattered electron images of the [001] surface with different magnifications.
Figure 2B:
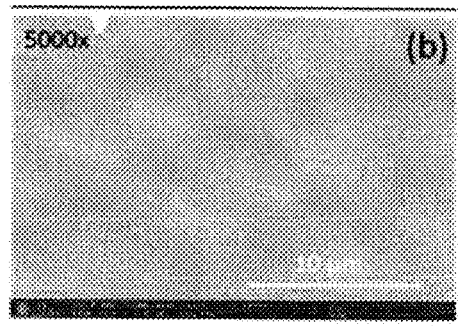
Figure 2C:
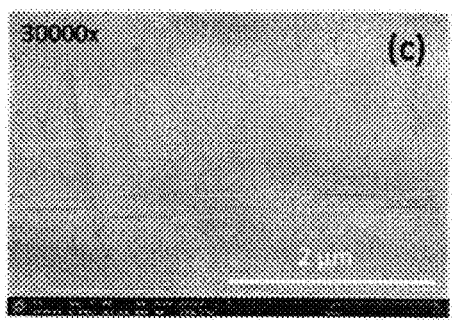
Figure 2D:
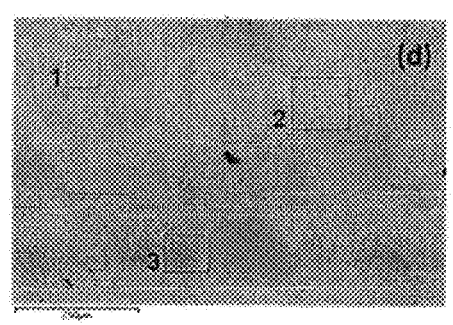
FIG. 2d shows the target areas for elemental X-ray analysis; i.e., target squares 1-3.

Well-formed plate-like crystals were obtained during self-flux single crystal growth from an initial loading composition $Ce_{18}Co_{62.32}Cu_{19.68}$ in a Ta container at 1050-1070° C. The excess of flux was decanted by centrifuging at nearly reaction temperature. The exact temperature profile of this crystal growth is presented in FIG. 1 (see insert). Rietveld fitting of powder X-ray pattern taken from crushed single crystals, FIG. 1, shows that all Bragg reflections are well indexed within $CaCu_5$-type structure (P6/mmm. a=4.943(1), c=4.032(1) Å), providing strong argument for single-phase nature of the as-grown crystals. Additionally, SEM backscattered electron images of these crystals, FIGS. 2a-2c, revealed uniformity of their polished [001] surface (even at magnifications close to ×30000) suggesting their single-phase nature. The elemental SEM X-ray analysis, FIG. 2d and Table 1 below, revealed that crystals represent, about 15-16 atomic % Cu-doped $CeCo_5$ phase with minor but critical Ta content of about 0.5-0.6 atomic %.

TABLE 1

| Area | Atomic Fractions | | | |
|---|---|---|---|---|
| | Co | Cu | Ce | Ta |
| 1 | 68.12 | 15.70 | 15.59 | 0.59 |
| 2 | 67.80 | 16.11 | 15.53 | 0.56 |
| 3 | 67.64 | 15.95 | 15.86 | 0.55 |

The minor presence of Ta, Table 1, is explained by slight dissolution of inner wall surfaces of Ta reaction container and diffusion of Ta atoms into reaction liquid during the long term dwelling process at the maximum temperature of 1200° C. in the high-temperature furnace for 9-10 hours as well as at ramping down to 1050° C. for 75 hours. Since no Ta precipitation or/and segregation was revealed during both SEM and XRD analyses, it was concluded that Ta was being either incorporated into the crystals structure interstices or uniformly distributed in the form of nano-sized precipitates, the detection of which is beyond the resolution of both instrumental methods applied.

Figures 7A, 7B:
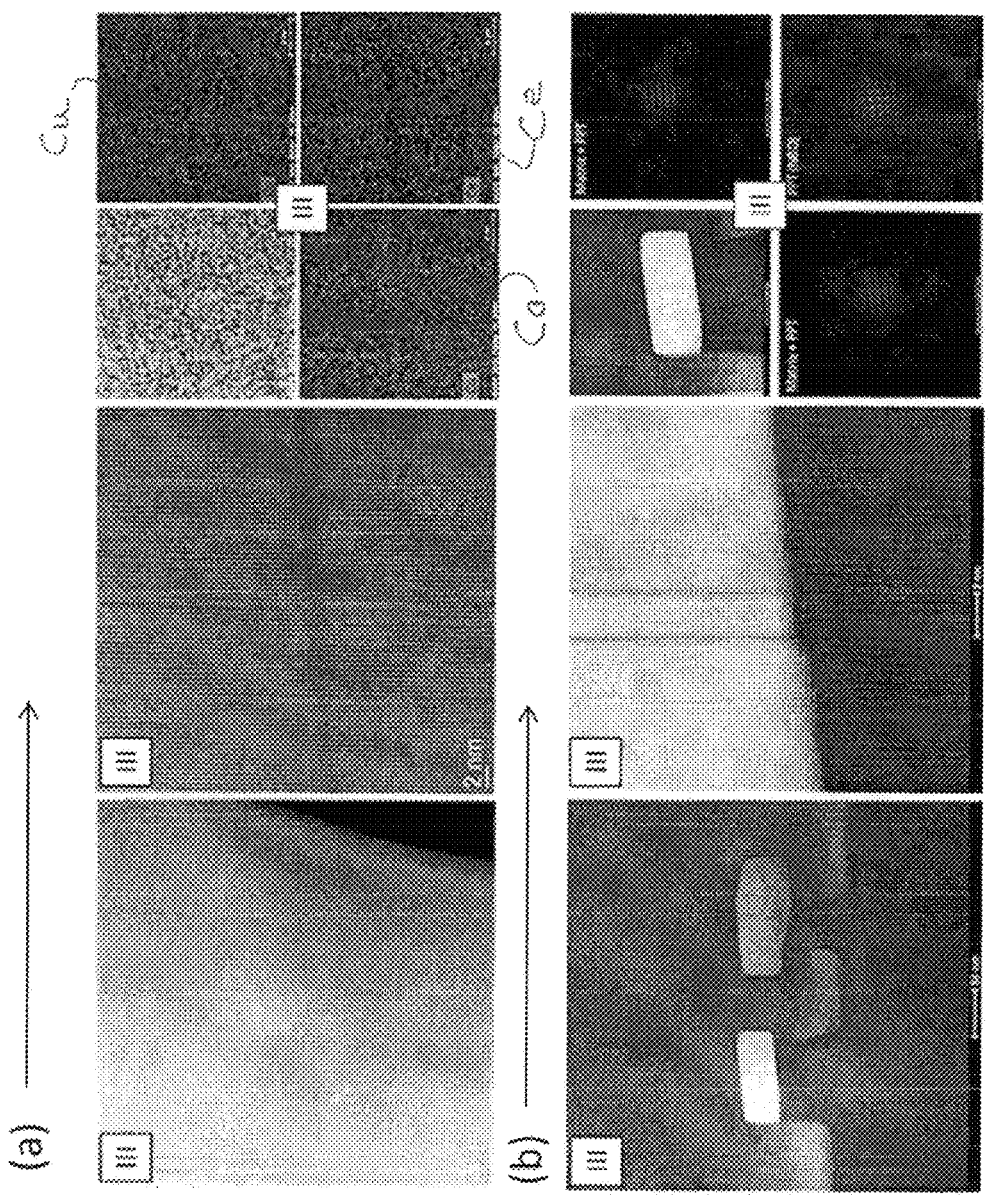
FIG. 7a shows high resolution TEM images of as-grown crystals of EXAMPLE #1, i.e., $Ce_{15.5}Ta_{0.6}Co_{67.8}Cu_{16.1}$ alloy.
FIG. 7b shows the TEM results for heat-treated crystals of EXAMPLE #1, i.e., $Ce_{15.5}Ta_{0.6}Co_{67.8}Cu_{16.1}$ alloy.

Interestingly, these single crystal samples showed magnetic hysteresis when measured along the easy axis of magnetization [001] with $H_c$=1.6 kOe and $B_r$=4.2 kG, $M_s$=about 4.2 kG and $(BH)_{max}$=about 3.7 MGOe, FIGS. 3a-3c. This by itself is remarkable considering common belief that appearance of the coercivity is a matter of the extrinsic properties; e.g., development off-proper microstructure for strong magnetic domain pinning. And, this is generally not associated with a single phase single crystal as suggested by the SEM and XRD examinations, where FIG. 1 and FIGS. 2a-2c, did not reveal any elemental precipitations, segregations, or/and any regular grain structure/microstructure. The detailed high resolution TEM examination of the as-grown sample of EXAMPLE #1, FIG. 7a, showed its basic uniformity and integrity with rare and small Co-enriched and Cu depleted regions/stripes which were coherent with the matrix. Unfortunately, the size of these stripes did not allow clear EDS composition determination or/and structural analysis. However, these may be embryonic structural defects caused by stacking faults trying to compensate various channel disorders of the material, although the inventors do not wish to be bound by any theory in this regard. On the other hand, these also might be the nucleation set points for the spinodal decomposition, although again the inventors do not wish to be bound by any theory in this regard.

Although in EXAMPLE #1 the Ta content was incorporated unintentionally, the following heat treatment experiments demonstrate a role that Ta plays a beneficial role in revealing and taking part in the formation of necessary microstructural modifications that improve magnetic properties; e.g., coercivity of the material.

Figure 4:
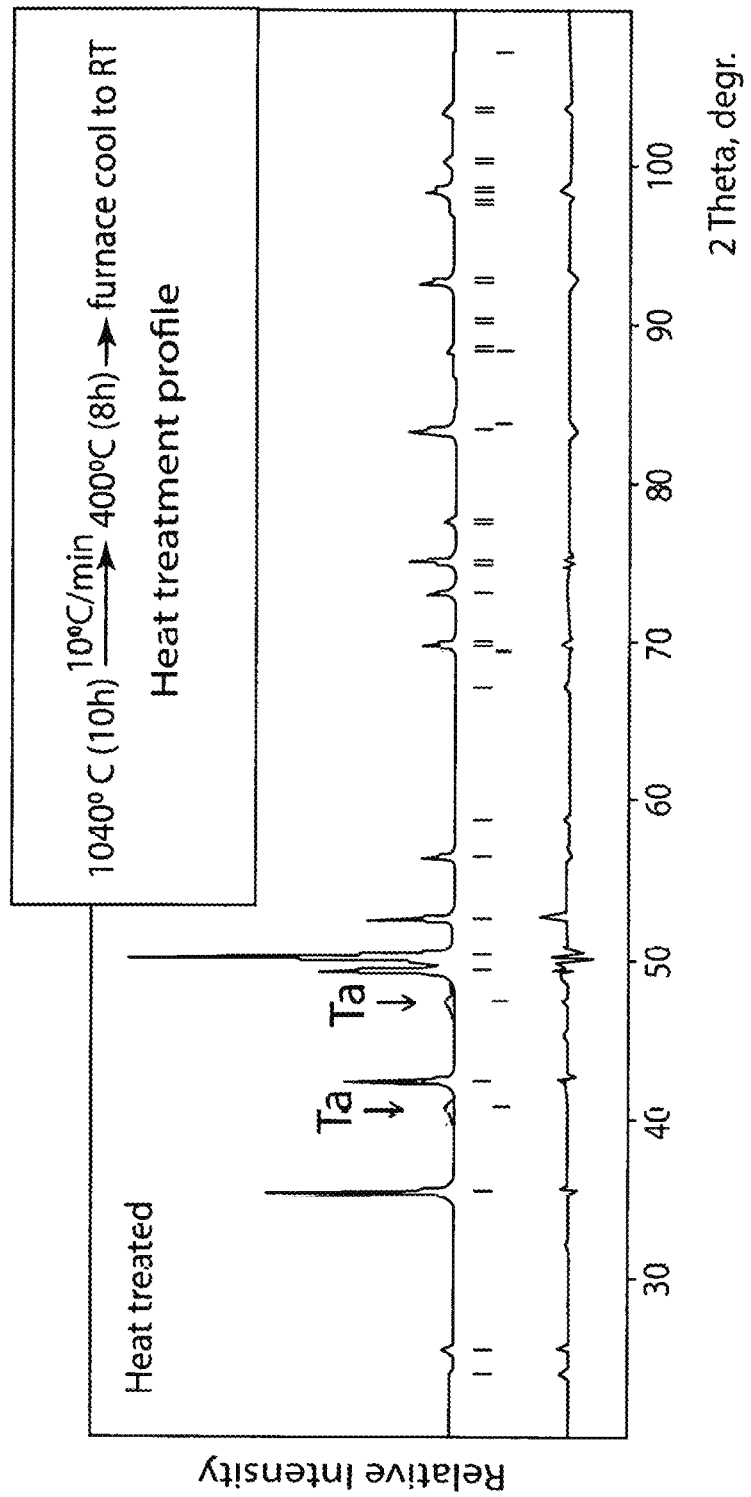
FIG. 4 shows a PXRD pattern and Rietveld refinement results for heat treated "COMPOSITE CRYSTAL" of EXAMPLE #1; i.e., $Ce_{15.5}Ta_{0.6}Co_{67.8}Cu_{16.1}$ alloy. The observed profile is indicated by circles and the calculated profile by solid line. Bragg peak positions are indicated by vertical ties, and the difference is shown at the bottom. The insert of FIG. 4 shows the temperature-time profile of the heat treatment.
Figure 5A:
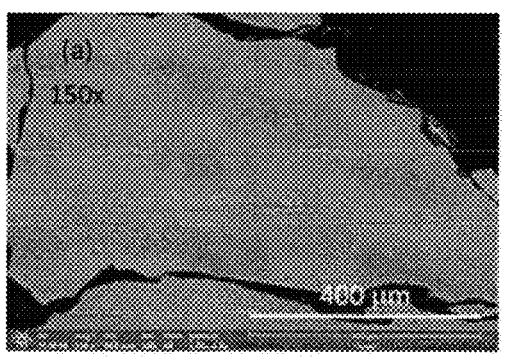
FIG. 5a-5d show SEM back scattered electron images of the heat treated "COMPOSITE CRYSTAL" of EXAMPLE
Figure 5B:
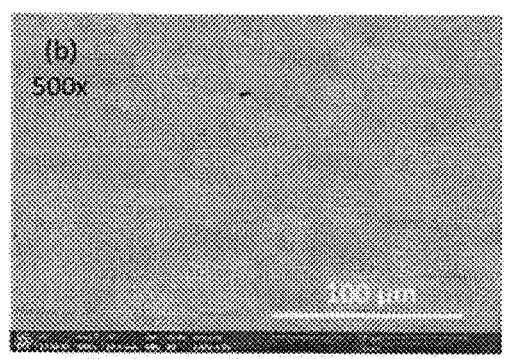
Figure 5C:
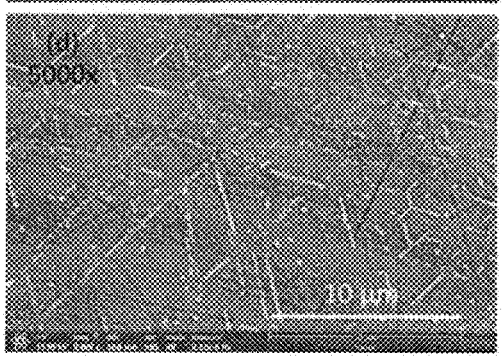
Figure 5D:
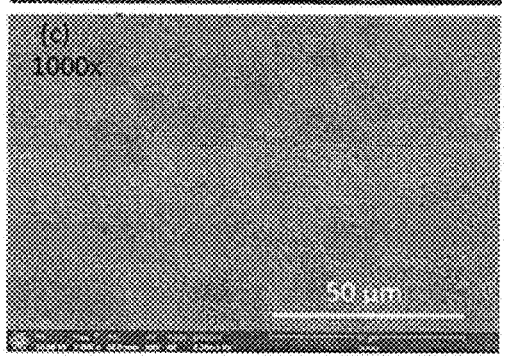

The heat treatment procedure included dwelling at 1040° C. for 10 hours and then cooling down at 10° C./minute to 400° C. for magnetic hardening, dwelling at this temperature for next 8 hours with subsequent furnace cool to room temperature. Phase analysis of powder X-ray pattern taken from crushed heat treated material, FIG. 4, revealed clear presence of Ta-like impurities (Fm-3m, a=4.446(1) Å) with a majority phase still retaining $CaCu_5$-type structure (P6/mmm, a=4.944(1), c=4.029(1) Å). SEM back scattered electron images taken from [001] surface of the heat treated crystals clearly contrasted to similar ones from the as-grown crystals, FIGS. 2a-2c, i.e., showing degradation of the uniformity and/or single phase nature of the crystal. Therefore the "single crystal" will no longer be used for accurate description of the material. Instead, the alternative tentative term "COMPOSITE CRYSTAL" will be used hereafter.

The "COMPOSITE CRYSTAL" exhibits bimodal microstructure that consists of darker matrix and lighter Ta-containing laminas in the single crystal matrix. These laminas, seemingly, fill-up the regular extended defects that formed in the single grain single crystal during the heat treatment. These laminas strictly follow the hexagonal symmetry of the original crystal, crossing each other at 60° and/or 120° angles of intersection, FIG. 5a-5d. The thickness of the laminar features was about 0.05-0.1 µm, and their lengths varied in the range of about 1 to about 10 µm. Distance (spacing) between two "parallel" laminas typically was about 2 to about 3 µm.

Figure 6A:
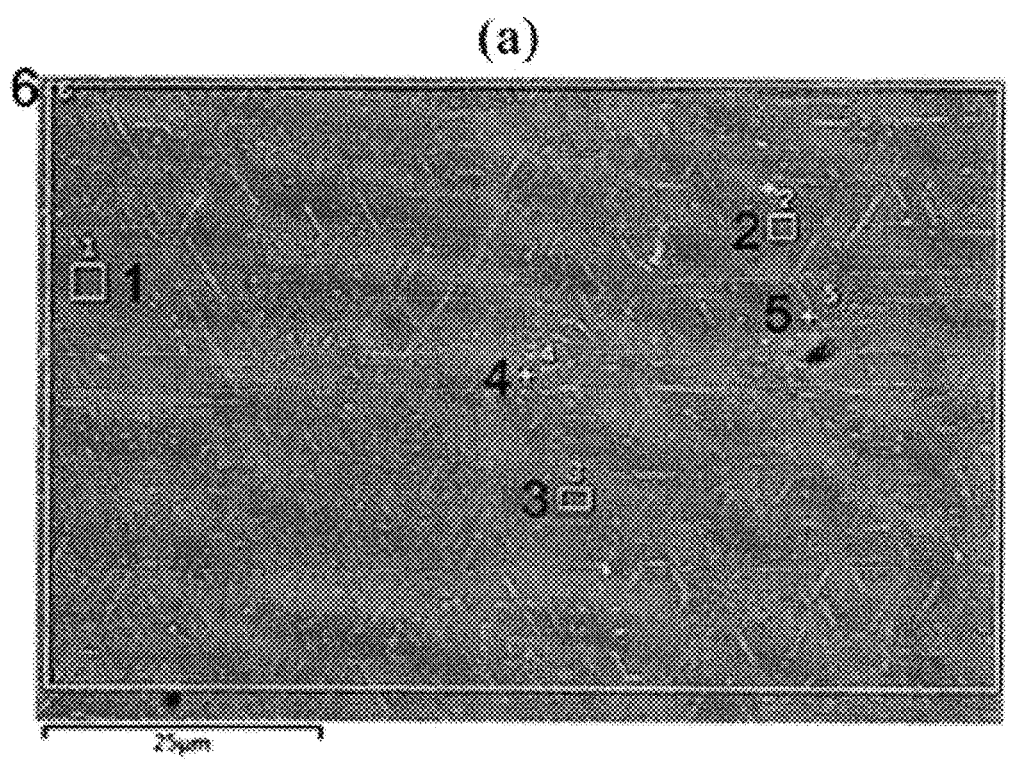
FIG. 6a shows a back scattered electron image of the [001] surface of the heat treated "COMPOSITE CRYSTAL" of EXAMPLE #1; i.e., $Ce_{15.5}Ta_{0.6}Co_{67.8}Cu_{16.1}$ alloy, and the target areas for SEM elemental X-ray analysis; namely, the target squares 1-3 (matrix) and targets 4 and 5 (laminas). Scale bar is 25 μm. A target area 6 (general/total image) investigated the general matrix.
Figure 6B:
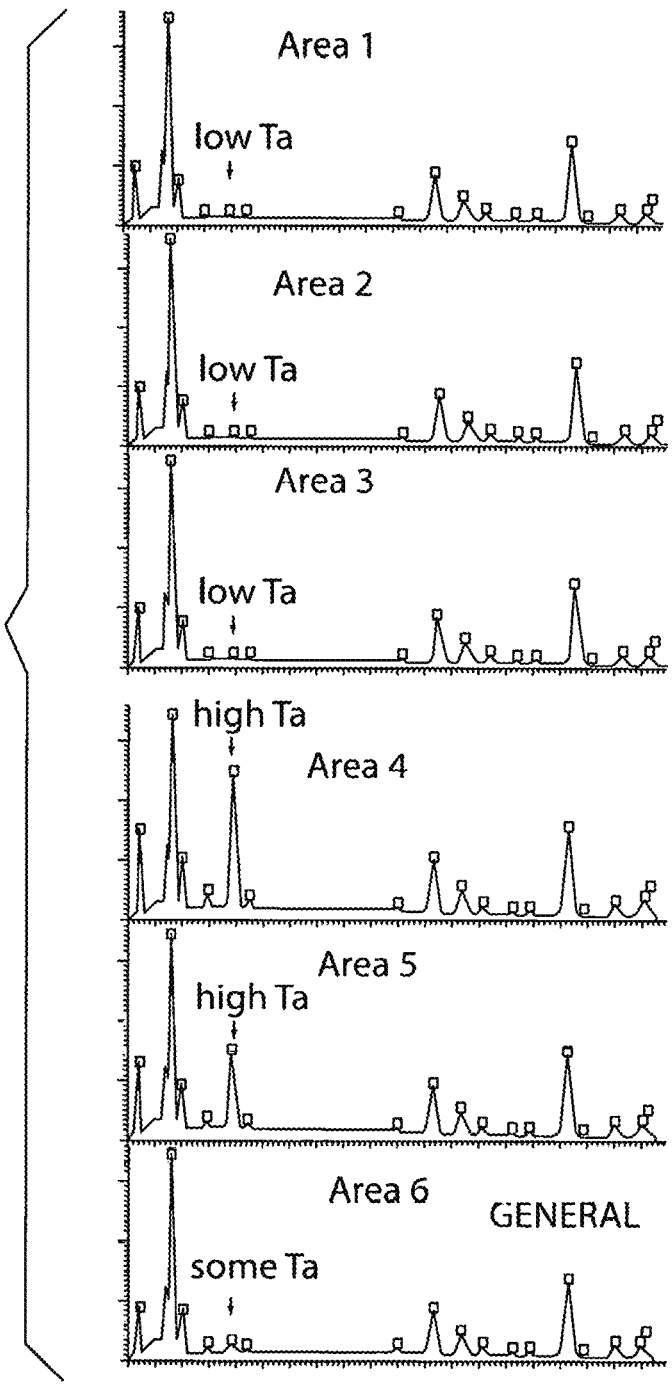
FIG. 6b shows SEM X-ray results for the target areas 1, 2, 3, 4, 5, and 6.

The elemental SEM X-ray analysis of the target areas 1-6 of the heat treated material appear in FIG. 6b and Tables 2 and 3, and clearly indicates segregation of Ta and/or Ta-rich phase into the laminar features, whereas only minor Ta concentrations are detected in the matrix material, Table 2. The TEM analysis confirmed that these are 90-95% pure rectangular blocks of Ta (according to diffraction patterns and elemental analysis), and their interfaces were coherent with the matrix material, FIG. 7b.

TABLE 2

| Area | Atomic Fractions | | | |
|---|---|---|---|---|
| | Co | Cu | Ce | Ta |
| 1 | 67.19 | 16.94 | 15.74 | 0.14 |
| 2 | 67.23 | 17.00 | 15.65 | 0.12 |
| 3 | 66.76 | 17.30 | 15.85 | 0.09 |

TABLE 3

| Area | Atomic Fractions | | | |
|---|---|---|---|---|
| | Co | Cu | Ce | Ta |
| 4 | 62.20 | 14.96 | 14.97 | 7.87 |
| 5 | 59.41 | 13.88 | 14.69 | 12.0 |
| 6 | 66.66 | 17.21 | 15.66 | 0.47 |

Formation of such "COMPOSITE CRYSTAL" appears to be responsible for profound change/improvement of magnetic properties after the heat treatment, i.e., significant increase of $H_c$ from about 1.6 to about 6.3 kOe yet with increase of $B_r$ ($M_s$) from about 4.2 (4.2) to about 5.3 (5.7) kG, resulting in $(BH)_{max}$ of about 7.8 MGOe, FIGS. 8a-8c. Thermodynamic transformation of single crystals during the heat treatment appears to create a 3D array of extended defects within primarily single grain single crystal. Although not wishing or intending to be bound by any theory, possible causes of this may be associated with Ta atoms leaving the matrix interstices at lower temperatures as independent thermodynamic event and/or in coincidence with matrix degradation induced by deceased miscibility at lower temperatures. These defects then may serve as pinning sites for magnetic domains creating necessary extrinsic conditions for magnetic coercivity.

Example #1A

In an attempt to reproduce the results of EXAMPLE #1 but in bulk ingot form and also for scaling-up material preparation, an approximate 8 gram are-melted button (ingot) was prepared to have the Ta-doped alloy composition of EXAMPLE #1; i.e., $Ce_{15.5}Ta_{0.6}Co_{67.8}Cu_{16.1}$. The alloy was prepared by arc-melting elemental constituents on a water-cooled copper hearth under partial vacuum with purified argon, rotated/flipped and re-melted twice for the homogenization.

Figure 9B:
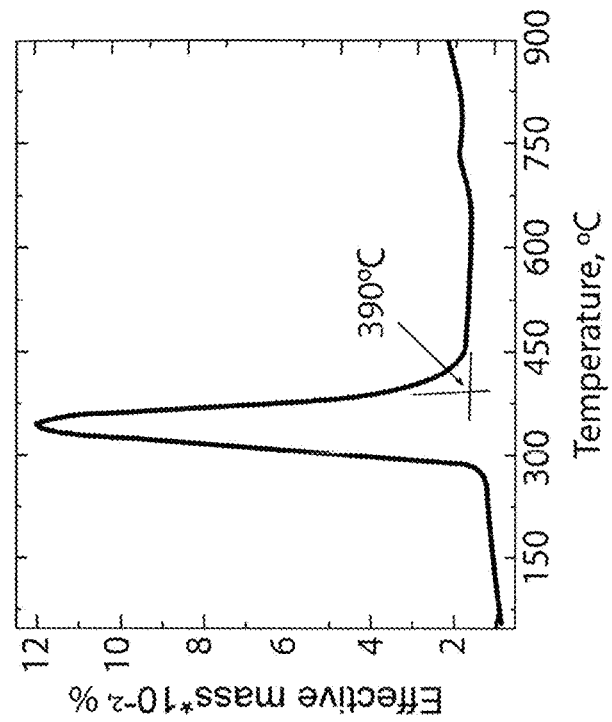
FIG. 9b shows the magnetic TGA measurement for the determination of the Curie temperature.
Figure 9A:
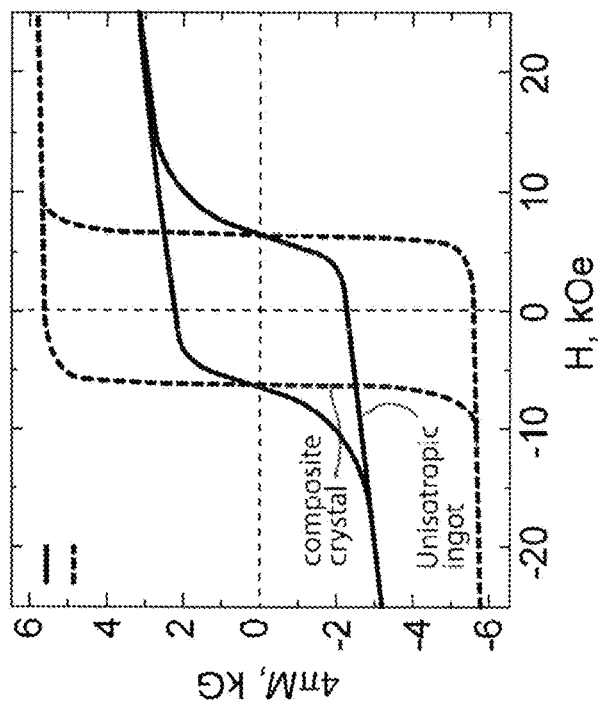
FIG. 9a shows the magnetic properties of "COMPOSITE CRYSTAL" in comparison to un-isotropic ingot of the EXAMPLE #1; i.e. $Ce_{15.1}Ta_{0.6}Co_{67.8}Cu_{16.1}$ alloy wherein magnetic hysteresis loops of the "COMPOSITE CRYSTAL" (gray circles) of the "COMPOSITE CRYSTAL" and of non-isotropic ingot (black circles) are shown.

FIG. 9a shows magnetic properties of both the bulk, non-aligned polycrystalline button (ingot) and the single crystal material after the same heat treatment; i.e., 1040° C. (10 hours)→cooling 10° C./min.→400° C. (8 hours)→furnace cool to room temperature, i.e., cooling in the turned-off furnace to room temperature. Seemingly, both bulk and single crystal materials show nearly the same coercivity values and differ in $B_r$ and $M_s$, FIG. 9a. The latter result is anticipated considering polycrystalline and non-aligned nature of the bulk sample. FIG. 9b also reveals a remarkable approximate 390° C. Curie temperature, which was evaluated by magnetic TGA method.

Example #2

This example illustrates that Fe-for-Co substitutions in the Ta-doped composition of EXAMPLE #1 can result in improvement of saturation magnetization up to about 60 to about 65%.

For example, an approximate 8 gram are-melted button (ingot) was prepared to have a Fe-modified alloy composition; i.e., $Ce_{15.5}Ta_{0.6}Co_{57.6}Fe_{10.2}Cu_{16.1}$ by arc-melting by arc-melting elemental constituents on a water-cooled copper hearth under partial vacuum with purified argon, rotated/flipped and re-melted twice for the homogenization.

Figure 10:
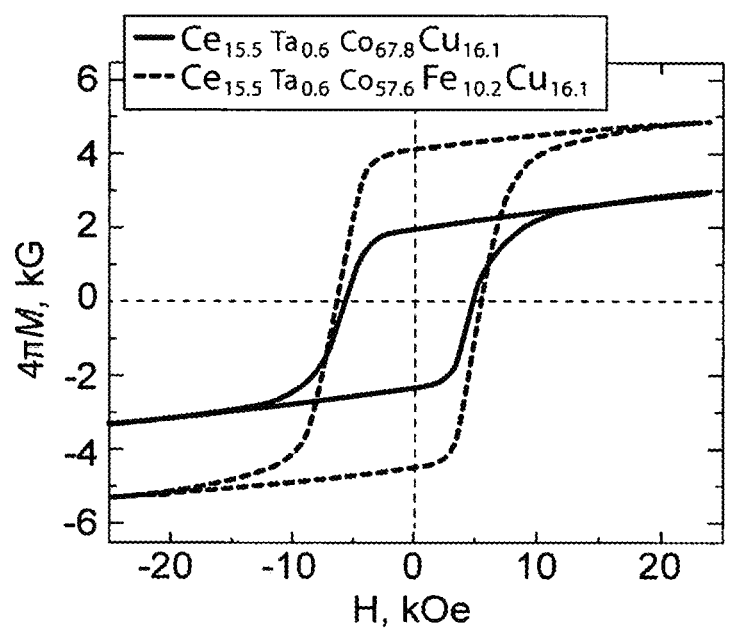
FIG. 10 shows the magnetic hysteresis loop of the bulk, un-aligned samples containing Fe substituted for Co and of the Fe-free alloy of EXAMPLE #1 showing improvement of both coercivities and magnetizations in the Fe-substituted sample, i.e., $H_c$ from about 6.3 to about 7.6 kOe, $B_r$ from about 2.1 to about 4.7 kG and $M_s$ from about 3.2 to 5.2 kG.

FIG. 10 shows comparison hysteresis loops of the Fe-substituted composition bulk, unaligned sample and of the original bulk unaligned sample of EXAMPLE #1. FIG. 10 shows improvement of both coercivities and magnetizations in the Fe-substituted sample; i.e., $H_c$ from about 6.3 to about 7.6 kOe, $B_r$ from about 2.1 to about 4.7 kG and $M_s$ from about 3.2 to 5.2 kG.

The present invention envisions that up to about 20 atomic % of Co can be substituted by less significantly expensive Fe with improvement of saturation magnetization up to about 60 to about 65%.

Example #3

This example illustrates successful growth of single crystals of both Ta-, and Fe-doped Ce/Co/Cu permanent magnet, i.e., $Ce_{14.3}Ta_{1.0}Co_{62.0}Fe_{12.3}Cu_{10.4}$.

Similarly as in EXAMPLE #1, well-formed plate-like crystals were obtained during self-flux single crystal growth from an initial loading composition $Ce_{18}Co_{55.8}Fe_{9.8}Cu_{16.4}$ in a Ta container at 1050-1070° C. The excess of flux was decanted by centrifuging at nearly reaction temperature. After performing the heat treatment identical to EXAMPLE #1, i.e., 1040° C. (10 hours)→cooling with rate 10° C./min.→400° C. (8 hours)→furnace cool to room temperature; i.e., cooling in the turned-off furnace to the room temperature, the EXAMPLE #3 showed significant improvement of magnetic energy characteristics reaching $(BH)_{max.}$=about 13 MGOe, FIGS. 11a, 11b.

Figures 11A, 11B:
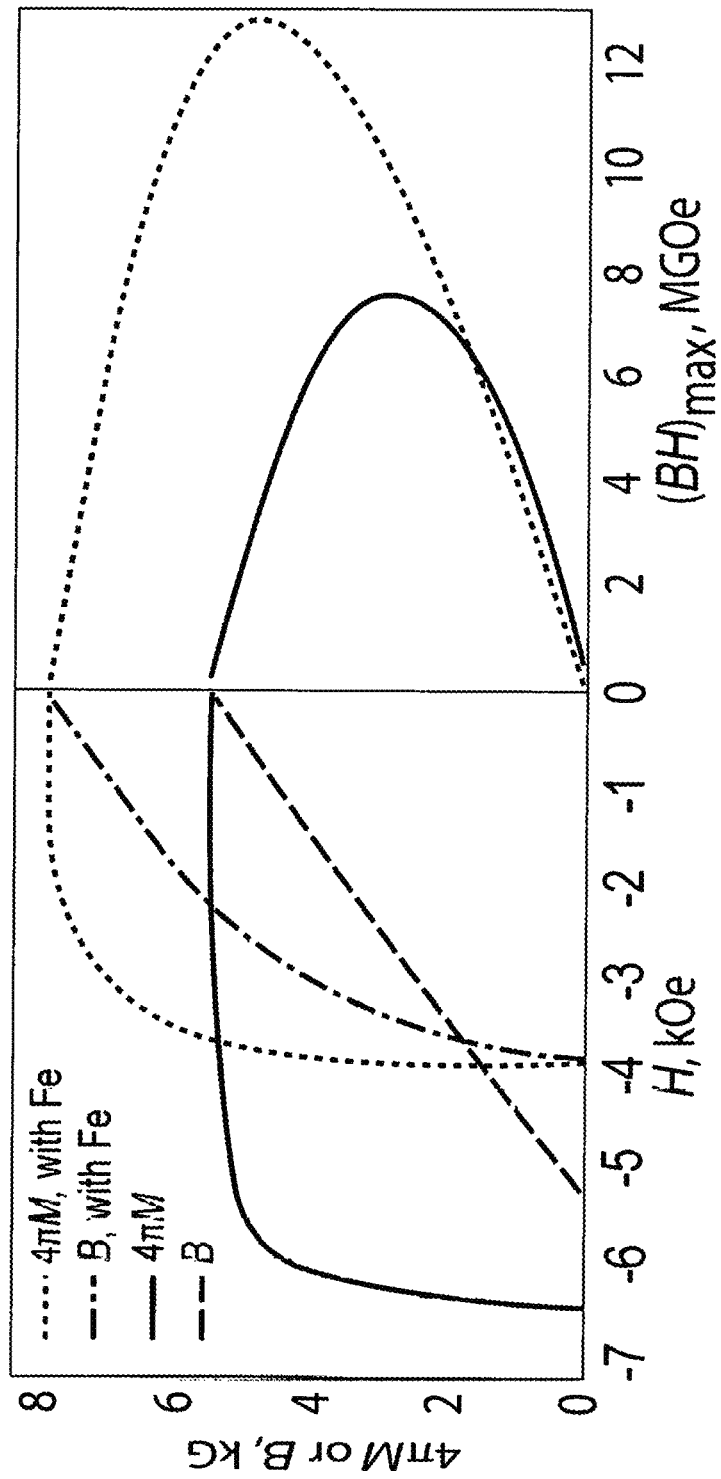
FIG. 11a shows the demagnetization 4πM and B curves of EXAMPLE #3 i.e., the $Ce_{14.3}Ta_{1.0}Co_{62.0}Fe_{12.3}Cu_{10.4}$ alloy, in comparison to EXAMPLE #1.
FIG. 11b shows an estimation of the of the energy product $(BH)_{max}$ of EXAMPLE #3 in comparison to that of Example #1.
Figure 12A:
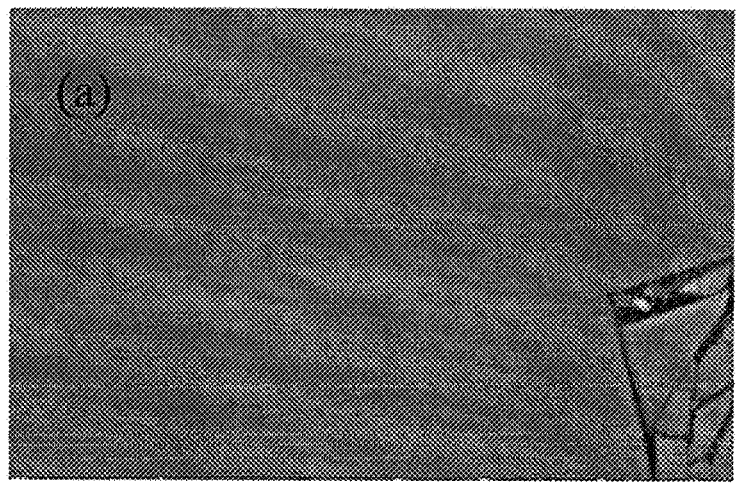
FIG. 12a shows a back scattered electron image of the [001] surface of as-grown crystal of EXAMPLE #3; i.e., $Ce_{14.3}Ta_{1.0}Co_{62.0}Fe_{12.3}Cu_{10.4}$ alloy. Scale bar is 10 μm.
Figure 12B:
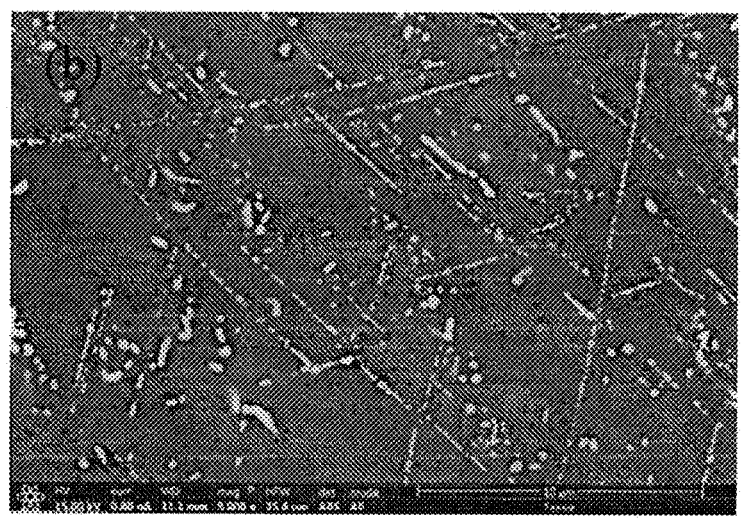
FIG. 12b shows a back scattered electron image of the [001] surface of "COMPOSITE CRYSTAL" of heat-treated EXAMPLE #3; i.e., $Ce_{14.3}Ta_{1.0}Co_{62.0}Fe_{12.3}Cu_{10.4}$ alloy.

Cobalt content is decreased by about 6 at. % in comparison to EXAMPLE #1, while $B_r$ increased by about 40% (to about 8 kG) in heat treated Fe-doped sample and $H_c$ in the Fe-doped sample is about 60% (about 0.4 T) from Fe-free sample, FIGS. 11a,11b.

FURTHER EXAMPLES

Table 4 represents compositions and main magnetic characteristics of the experimental examples that are embodiments of the invention. Both single-crystalline and polycrystalline synthetic approaches were used for sample preparation. Detailed description of the synthetic approaches is presented below.

In an attempt to reproduce the results of single-crystalline examples (see Table 4, EXAMPLES #3a, 4a and 6a) in bulk ingot form and also for scaling-up material preparation, an approximate 8 gram arc-melted buttons (ingots) were prepared to have the Ta-doped alloy composition of EXAMPLE #3, 4 and 6, respectively. Also the polycrystalline arc-melted examples were tested with various Ta contents, i.e., EXAMPLES #7-9. The alloys were prepared by arc-melting elemental constituents on a water-cooled copper hearth under partial vacuum with purified argon, rotated/flipped and re-melted twice for the homogenization.

The EXAMPLE #10 was synthesized in the alumina crucible, jacked in a fused silica, under the argon gas atmosphere. This synthetic approach was used to test reactivity of the components with the alumina crucible, since the alumina crucible syntheses are common casting techniques. The experiment confirmed that the Ce/Co/Cu gap magnets can be prepared in alumina crucibles. Magnetic characteristics of the EXAMPLE #10 (see Table 4) are comparable to the single crystal growth results of EXAMPLE #3. The EXAMPLE #11 represents a Hf-doped polycrystalline sample (see Table 4) prepared by arc-melting as described above for EXAMPLES 7-9.

Table 4 shows magnetic properties of all the bulk, wax-aligned polycrystalline button (ingot) and the single-crystalline material after the same heat treatment; i.e., 1040° C. (10 hours)→cooling 10° C./hour →400° C. (8 hours) →furnace cool to room temperature, i.e., cooling in the turned-off furnace to room temperature. Seemingly, prepared by different methods (single crystal growth, arc-melting, alumina crucible) and in small (3 gram) and larger quantities (8 gram), these systems reach comparable energy characteristics. This confirms high reproducibility of the initial experiments and shows the good perspectives for scaling-up, manufacturing and mass production.

TABLE 4

Experimental examples of the Ce/Co/Cu gap magnets containing refractory metal (Ta or Hf) and optionally Fe, with compositions, synthesis methods and magnetic characteristics. The best examples are emphasized by gray shading. The experimental examples 1a and 2 (see above) were not aligned, thus their magnetic characteristics are not finalized and not presented in the Table.

| Example # | Synthesis method | Composition, at. % | | | | | $\rho$ (g/cm³) | $M_s$ (kG) | $B_r$ (kG) | $H_c$ (kOe) | $(BH)_{max.}$ (MGOe) | $T_c$ (K) |
|---|---|---|---|---|---|---|---|---|---|---|---|---|
| | | Ce | Ta(Hf) | Co | Fe | Cu | | | | | | |
| 4 | Single crystal growth I | 15.1 | 1.0 | 74.4 | — | 9.5 | 8.5 | 6.7 | 5.9 | 0.4 | 1.0 | 670 |
| 4a | Polycrystalline, arc melted | 15.1 | 1.0 | 74.4 | — | 9.5 | 8.5 | 5.8 | 5.5 | 1.5 | 3.8 | n/a |
| 5 | Single crystal growth II | 16.3 | 0.6 | 68.9 | — | 14.2 | 8.4 | 5.9 | 5.5 | 2.9 | 6.4 | 515 |
| 1 | Single crystal growth III | 15.7 | 0.6 | 67.8 | — | 15.9 | 8.5 | 5.8 | 5.5 | 6.3 | 7.8 | 490 |
| 6 | Single crystal growth IV | 16.3 | 0.3 | 61.7 | — | 21.7 | 8.5 | 4.1 | 3.8 | 8.2 | 3.4 | 450 |
| 6a | Polycrystalline, arc-melting | 16.3 | 0.3 | 61.7 | — | 21.7 | 8.5 | 4.2 | 3.8 | 9.1 | 3.2 | n/a |
| 3 | Single crystal growth V | 14.3 | 1.0 | 62.0 | 12.3 | 10.4 | 8.3 | 8.1 | 8.0 | 3.4 | 12.8 | 820 |
| 7 | Polycrystalline, arc-melting | 15.4 | 0.1 | 62.0 | 12.0 | 10.5 | 8.4 | 6.6 | 6.2 | 4.4 | 7.5 | n/a |
| 8 | Polycrystalline, arc-melting | 15.0 | 0.5 | 62.0 | 12.0 | 10.5 | 8.4 | 7.7 | 7.4 | 3.9 | 10.2 | n/a |
| 3a | Polycrystalline, arc-melting | 14.3 | 1.0 | 62.0 | 12.0 | 10.4 | 8.4 | 8.1 | 7.8 | 3.8 | 11.0 | n/a |
| 9 | Polycrystalline, arc-melting | 14.2 | 1.3 | 62.0 | 12.0 | 10.5 | 8.4 | 7.3 | 7.2 | 3.3 | 9.4 | n/a |
| 10 | Polycrystalline, alumina crucible | 16.6 | 0.1 | 59.3 | 13.7 | 10.3 | 8.3 | 7.3 | 7.2 | 4.2 | 12.4 | 695 |
| 11 | Polycrystalline, arc-melting | 15.0 | 0.7 (Hf) | 61.8 | 12.1 | 10.4 | 8.4 | 7.6 | 7.3 | 5.2 | 12.5 | ~800 |

Figure 23A:
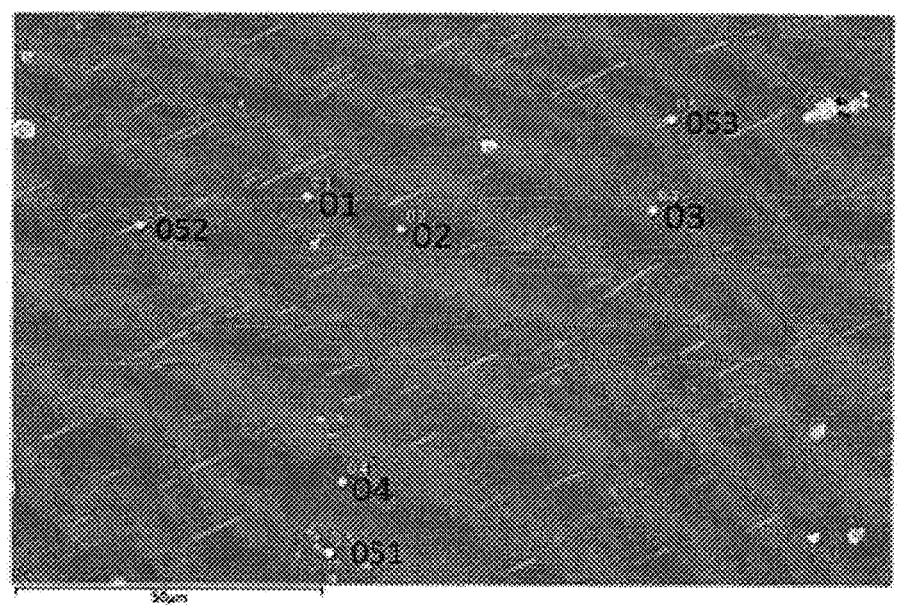
FIG. 23a shows a back scattered electron image of the polished surface of the heat treated polycrystalline sample of EXAMPLE #11; i.e., $Ce_{15.0}Hf_{0.7}Co_{61.8}Fe_{12.1}Cu_{10.4}$ alloy, and the target areas for SEM elemental X-ray analysis; namely, the target squares 0 1-0 4 (matrix) and targets 0 5 1-0 5 3 (laminar precipitates). Scale bar is 50 μm.
Figure 23B:
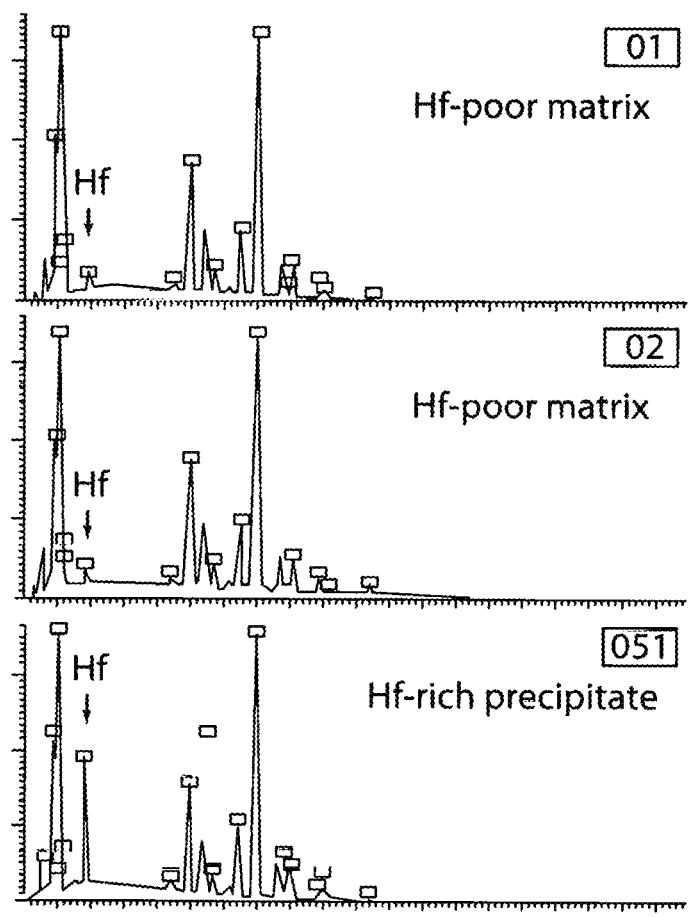
FIG. 23b shows SEM/EDS X-ray results for the target areas 1, 2, and 0 b 1.
Figure 24:
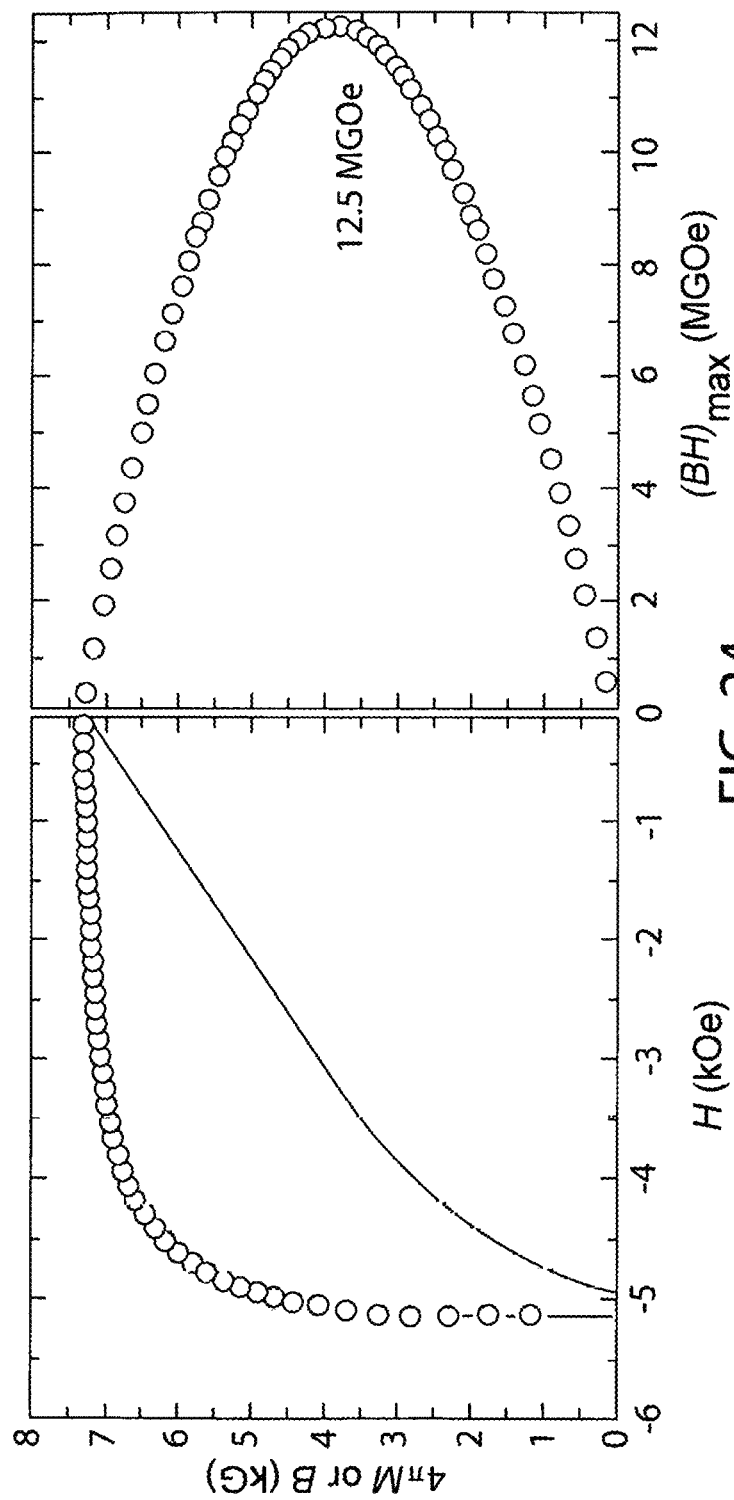
FIG. 24 shows the demagnetization $4\pi M$ and B curves of EXAMPLE #11 i.e., the $Ce_{15.0}Hf_{0.7}Co_{61.7}Fe_{12.1}Cu_{10.4}$ alloy in the left panel and shows an estimation of the of the energy product $(BH)_{max}$ of the EXAMPLE #11 in the right panel.

Note that EXAMPLE #11 representing the Hf-doped polycrystalline sample (see Table 4) showed the best combination of magnetization and coercivity among all examples presented in Table 4; e.g. see FIG. 24. Example #11 showed a microstructure having Hf-containing laminas in the matrix in similar fashion as the Ta-doped samples having Ta-containing laminas after the above heat treatment (see FIG. 23a-23b and FIG. 23c containing Table 8.

Single-Crystalline Samples

The following examples demonstrate synthesis, structure, and magnetic properties of Ta-, Cu- and Fe-substituted $CeCo_5$ magnet alloys. Using a self-flux technique, single crystals of sample I—$Ce_{15.1}Ta_{1.0}Co_{74.4}Cu_{9.5}$, sample II—$Ce_{16.3}Ta_{0.6}Co_{68.9}Cu_{14.2}$), sample III—$Ce_{15.7}Ta_{0.6}Co_{67.8}Cu_{15.9}$, sample IV—$Ce_{16.3}Ta_{0.3}Co_{61.7}Cu_{21.7}$, (EXAMPLE and sample V—$Ce_{14.3}Ta_{1.0}Co_{62.0}Fe_{12.3}Cu_{10.4}$ were grown. The single crystals III and V correspond to EXAMPLE #1 and EXAMPLE #3 which were mentioned earlier as initial/provisional results (see above). A comprehensive and detailed characterization of the samples is presented below with respect to magnetic behavior and unique magnetic characteristics; i.e., coercivity mechanism.

EXPERIMENTAL

Single crystals were grown via the solution growth method described by P. C. Canfield et al. "Growth of single crystals from metallic fluxed", Philos. Mag., 65, 1117-1123 (1992) and P. C. Canfield et al. "Properties and Applications of Complex Intermetallics, Solution Growth of Intermetallic Single Crystals: A Beginner Guide", edited by Belin-Ferre, Chap. 2, (World Scientific, Singapore 2010), the teachings of which are incorporated herein by reference to this end. The reaction metals (Ce (99.99%), Cu (99.95%) from Ames Laboratory MPC (Material Preparation Center) and Co (99.95%) from Alfa Aesar) were placed into 3-capped Ta containers (see reference 40) welded under an Ar atmosphere, which then were sealed into fused silica tubes and placed into a high-temperature box furnace. The furnace was heated from near room temperature to 900° C. over 3 hours, held at 900° C. for 3 hours, heateds to 1200° C. over three more hours, and held at 1200° C. for 10 hours. The furnace was then cooled to 1070° C. over 75 hours. At 1070° C. the excess flux was decanted by centrifuging (see Canfield references above). Decanting took place as the centrifuge accelerated from rest toward a 8.5 krpm set point.

Heat Treatment:

After growth, some single crystals underwent identical, two-stage, heat treatments performed in a Dentsply Ceramico (Vulcan 3-Series) multi-stage programmable furnace, which included dwelling at 1040° C. for 10 hours, then cooling at a rate of 10° C./min to 400° C. followed by dwelling at this temperature for the next eight hours with a subsequent furnace cool to room temperature. Different Cu contents may require slightly different temperature/time parameters for the best final magnetic characteristics and can be determined empirically.

TABLE 5

Composition of single crystals (with standard deviation) and their lattice parameters as-grown and after the heat treatment.

| | EDS-composition, at. % | | | | | | | | | Lattice parameters | |
| | Ce | | Ta*** | | Co | | Fe | | Cu | | $a, c, \text{Å}; V, \text{Å}^3$ **** | |
| # | ag* | ht** | ag | ht | Ag | Ht | ag | Ht | Ag | ht | Ag | Ht |
| I | 15.1(1) | 16.1(1) | 1.0 | 0.6 | 74.4(2) | 73.6(2) | — | — | 9.5(1) | 9.8(1) | 4.912(1) 4.045(1) 84.52(1) | 4.921(1) 4.031(1) 84.58(2) |
| II | 16.3(1) | 16.2(1) | 0.6 | 0.4 | 68.9(2) | 69.4(2) | — | — | 14.2(1) | 14.0(1) | 4.933(1) 4.031(1) 84.95(2) | 4.933(1) 4.028(1) 84.90(2) |
| III | 15.7(1) | 15.8(1) | 0.6 | 0.1 | 67.8(2) | 67.1(2) | — | — | 15.9(1) | 17.1(1) | 4.943(1) 4.032(1) 85.31(1) | 4.944(1) 4.028(1) 85.26(1) |
| IV | 16.3(1) | 16.5(1) | 0.3 | 0.05 | 61.7(2) | 61.9(2) | — | — | 21.7(1) | 21.6(1) | 4.950(1) 4.033(1) 85.57(2) | 4.951(1) 4.028(1) 85.61(2) |
| V | 14.0(1) | 13.9(1) | 1.0 | 0.2 | 62.0(2) | 62.7(2) | 12.3(1) | 13.0(1) | 10.4(1) | 10.2(1) | 4.922(1) 4.075(1) 85.50(2) | 4.924(1) 4.071(1) 85.48(2) |

*as-grown,
**heat-treated: 1040 C. (10 h) > [10° C./min]→ 400° C. (8 h),
***standard deviations for Ta vary within 0.02-0.05 at. %;
**** space group: P 6/mmm Samples for metallographic examination were placed in 1 inch diameter epoxy resin pucks, and polished with various grits of silicon carbide followed by a glycol-based, fine, polycrystalline, diamond suspension. Plate-like single crystals were mounted with their plates parallel to the polishing surface to allow for characterization along planes perpendicular to the crystals [001] direction. Imaging studies of single crystal samples were per-formed on an FEI Teneo field emission scanning electron microscope. Their compositions were determined via energy dispersive X-ray spectra obtained using an Oxford EDS/EBSD module averaging over 3-5 regions on their metallographically prepared surfaces [see Table 5].

Tem Characterization:

Cross sections from single crystal sample III were prepared using a dual-beam focused ion beam system (FEI Helios NanoLab G3 UC) with a lift-out approach. To reduce surface damage sustained during Ga ion milling, the final thinning and cleaning step were conducted using 5 kV and 2 kV for 5 min. The TEM analysis was performed on a Titan Themis (FEI) probe Cs-corrected TEM equipped with a Super-X EDS detector to characterize microstructure and elemental distribution.

Powder and Single Crystal X-Ray Diffraction:

Polycrystalline powders were obtained by crushing the sample with an agate mortar and pestle. X-ray power diffraction data were collected from the as-grown and heat-treated crystals. The measurements were per-formed using PANalytical X-Pert Pro (Co $K_\alpha$—radiation, $\lambda$=1.78897 Å) and Bruker D8 Advance (Cu $K_\alpha$—radiation, $\lambda$=1.54056 Å) diffraction systems. Powdered samples were evenly dispersed on a zero-background Si— holder with the aid of a small quantity of vacuum grease. Diffraction scans were taken in the $\theta/2\theta$ mode with the following parameters: $2\theta$ region: 20-110°, step scan: 0.02°, counting time per step: 60 s. The FullProf Suite program package (see reference 41) was used for Rietveld refinement of the crystal structures.

Single-crystal diffraction data were collected at room temperature using a Bruker SMART APEX II diffractometer (Mo $K_\alpha$—radiation) equipped with a CCD area detector. Four sets of 360 frames with 0.5° scans in $\omega$ and exposure times of 10-15 s per frame were collected. The reflection intensities were integrated using the SAINT subprogram in the SMART software package, Bruker AXS Inc., Madison, Wis. 1996. The space group was determined using the XPREP program and the SHELXTL 6.1 software package, Bruker AXS Inc., Madison, Wis. 2000. Empirical absorption corrections were made using the SADABS program (R. H. Blessing, "An empirical correction for adsorption", Acta.Crystallographica Section A Foundations of Crystallogrpahy, 51, 33-38 (1995). Finally, each structure was solved by direct methods using SHELXTL 6.1 and refined by full-matrix least-squares on $F_o^2$, with anisotropic thermal parameters and a secondary extinction parameter.

Magnetic Properties Measurements:

Magnetic property measurements were obtained using a vibrating sample magnetometer in a cryogen-free VersaLab physical property measurement system (Quantum Design) with magnetic fields up to 3 T and temperatures in the 50-350 K range using the standard option and 300-1000 K range using the oven option. An alumina cement (Zircar) was used to hold the sample on the heater stick for the high-temperature measurements. The demagnetization factors are determined experimentally using the relation $H_{int.}$=H−NM.

Figure 13C:
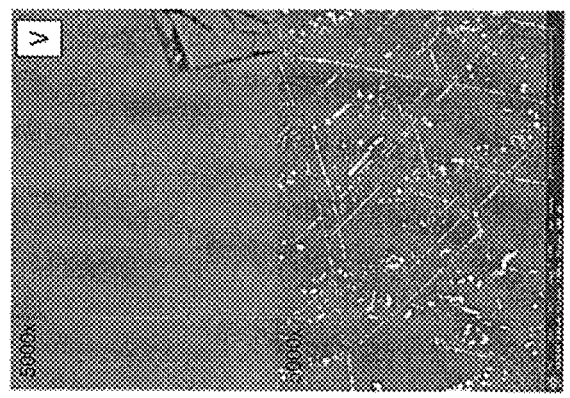
FIG. 13a-13c are SEM backscattered electron images of samples wherein (FIG. 13a)-sample III—$Ce_{15.7}Ta_{0.6}Co_{67.8}Cu_{15.9}$.
Figure 13B:
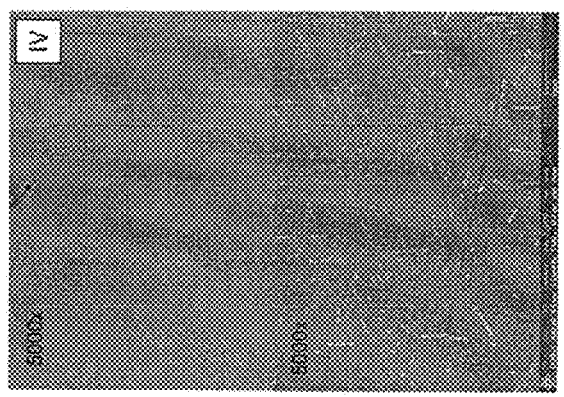
Figure 13A:
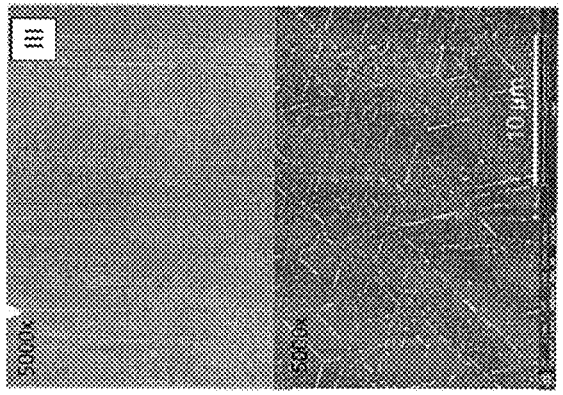
Figure 16C:
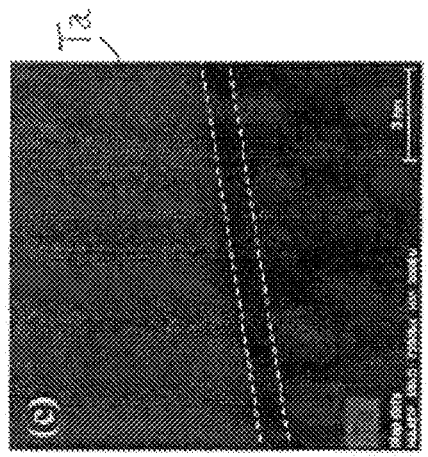
FIGS. 16b-16f show corresponding EDS elemental mapping results.
Figure 16F:
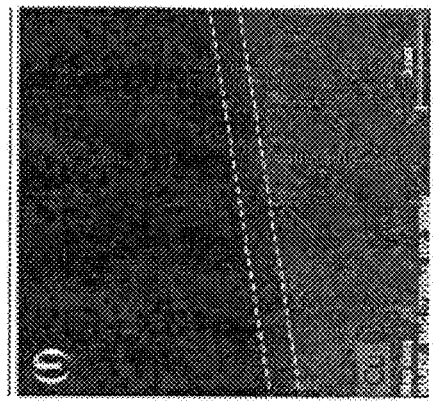
Figure 16B:
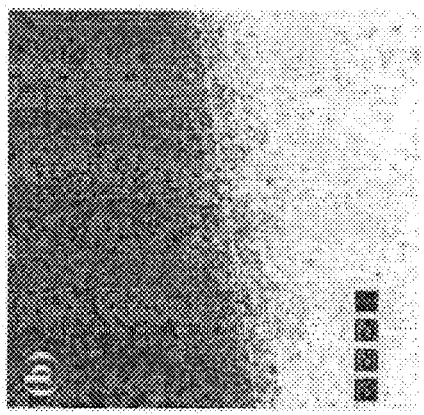
Figure 16E:
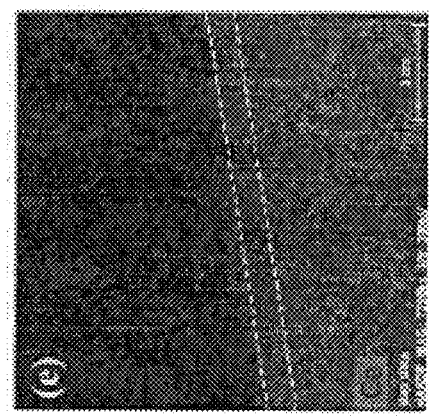
Figure 16A:
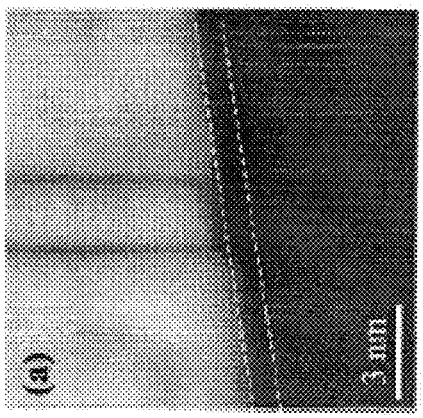
FIG. 16a is a high resolution HAADF image of the interface (dashed lines) between the matrix and the Ta precipitate taken from boxed area in FIG. 15d.
Figure 16D:
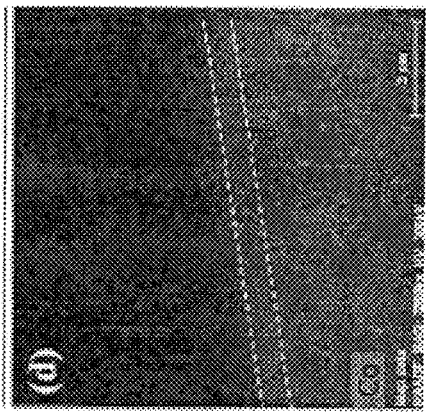

Structure and Composition Analysis:

SEM/EDS Examinations and Composition Analysis:

The SEM backscattered electron images of the as-grown crystals [FIG. 13a-13c, upper panels] display the uniformity of their (0001) polished surface (even at ×30,000 magnification) which suggests a single-phase. Elemental EDS analysis [Table I] showed the Ce,Co/Cu ratios are close to the 1:5 stoichiometry with Cu contents increasing from ~10 to ~22 at. %, corresponding to 12-26% of Co/Cu substitution. With respect to Ce content, crystal sample I and sample III contain 15-15.7 at. %, which is lower than the Ce content in sample II and sample IV and significantly lower than 16.7 at. % Ce content required for the exact 1:5 type stoichiometry. Also a minor presence of Ta (0.3-1 at. %) was detected in all five samples. The Ta content appears to be correlated to the Cu content as seen in [Table 5]. The presence of Ta is explained by the slight dissolution of the inner walls of the Ta reaction container and diffusion of Ta atoms into the liquid at high temperatures. Since no Ta precipitation or segregation was observed in the SEM/EDS analysis of the as-grown crystals, Ta is either being incorporated into the crystal structure as interstices or as uniformly distributed nano-scale precipitates, although the inventors do not intend or wish to be bound by any theory in this regard. However the slight Ce depletion and the presence of Ta suggest the possibility of minor deviations from the classic $CaCu_5$-type crystal structure towards various channel disorders or "dumb-bell" problems characterized elsewhere by O. Bodak et al., "Structural and magnetic properties of iron-rich compounds in the Yb—Fe—Al system", Journal of Alloys and Compounds 354, L10-L15 (2003); Ya. O. Tokaychuk et al., "Structural and magnetic properties of iron-rich compounds in the Yb—Fe—Ga system", Journal of Alloys and Compounds 415, 8-11 (2006); and Radovan Cerny et al., Local atomic order in the vicinity of Cu2 dumbbells in $TbCu_7$-type $YCu_{6.576}$ studied using bragg and total scattering techniques", Intermetallics 17, 818-825 (2009).

The SEM back scattered electron images taken from the (0001) surface of the heat treated crystals, [FIG. 13a-FIG. 13c lower panels], show degradation of the single phase crystal into a bimodal microstructure consisting of a darker matrix and lighter laminas. These laminas follow the hexagonal symmetry of the original crystal crossing each other at 60° or 120° angles. The thickness of the laminar features is ~0.05-0.1 μm, and their lengths vary in the range ~1-10 μm. Distances between two laminas are ~2-3 μm. The elemental EDS analysis of the heat treated material [Table 5] indicates the segregation of Ta-rich phases into the laminar features, whereas the matrix material becomes practically Ta-free in the Cu-richest crystal sample IV.

X-Ray Crystal Structure Determination:

Powder and single crystal X-ray analyses were performed to determine the structure of crystals samples I-V. Rietveld fitting of the powder X-ray pattern taken from the as-grown, crushed and thoroughly powdered, single crystals of samples I-V showed that all Bragg reflections were well indexed within the $CaCu_5$-type structure (hP6, P6/mmm), providing strong evidence for the single-phase nature of the as-grown crystals in agreement with our SEM observations [FIG. 13a-13c]. To address the EDS-observed Ta presence and Ce deficiency, especially in the as-grown crystals samples I, III, and V [see Table 5], known structural derivatives of $CaCu_5$ were considered (O. Bodak et al., "Structural and magnetic properties of iron-rich compounds in the Yb—Fe—Al system", Journal of Alloys and Compounds 354, L10-L15 (2003)). These derivatives are typically observed in binary and ternary rare-earth—transition metal systems near the 1:5 and 2:17 stoichiometries and result from the replacement of rare-earth atoms by pairs of transition metal atoms. The $CaCu_5$ substructure can be retained if the replacement is fully random, as in $TbCu_7$, but may be transformed into various superstructures, such as $Th_2Zn_{17}$, $Th_2Ni_{17}$, etc., if the substitution is ordered. A third possibility comes as combination of ordered and disordered rare-earth; i.e. "dumb-bell" substitutions which are contained in a superstructure, e.g., $LuFe_{9.5}$ and $PrFe_7$. Rietveld refinements with structural models allowing the presence of Ta were tried but the clear indexing of Bragg reflections within the parent, $CaCu_5$-type, 1:5 structure indicated a minor and random distribution of Ta.

Single crystal structure solutions of samples III-V confirmed their $CaCu_5$ substructure (Tables 6, 7). However, disorder was detected within the 1D hexagonal channels, i.e., the residual electron density peaks of about 5.0, about 3.8 and about 13.2 e/Å$^3$ at (0 0 z), z about 0.295 for samples III, IV and V, respectively. Only by filling the 2e site with the heaviest and largest available pair, Ta-Ta, was it possible to reach satisfactory refinement. The R1/wR2 residuals dropped by 50-70% in comparison to the solutions without Ta and showed minimal fluctuations of the rest electron density in the final fits. Differential Fourier maps for samples III-V with and without the "dumb-bell" showed disorder.

One significant deficiency of the solutions is the interatomic T-T distances of 2.35 Å, which is typical for Co—Co, Co—Cu pairs but is extremely short for Ta-Ta. However, the "dumb-bell" configuration with large and heavy atoms similar to Ta is not unprecedented and was reported for similar structure of $CeFe_{10}Zr_{0.8}$ ($d_{(Zr-Zr)}$ 2.65 Å). However, the stoichiometry of sample V shows significant deviation from the ideal 1:5 stoichiometry. The content of 1D channels (Ce plus the Ta-Ta pairs) does not reach the expected 16.7 at. %, meaning that some of Ta atoms must participate in the channel disorder, although the inventors do not wish or intend to be bound by any theory in this regard.

TABLE 6

Single crystal and Refinement Data for III - $Ce_{15.7}Ta_{0.6}Co_{67.8}Cu_{15.9}$, IV - $Ce_{16.3}Ta_{0.3}Co_{61.7}Cu_{21.7}$, V - $Ce_{14.3}Ta_{1.0}Co_{62.0}Fe_{12.3}Cu_{10.4}$.

| Crystal | III | IV | V |
| --- | --- | --- | --- |
| EDS composition | $Ce_{0.94}Ta_{0.04}Co_{4.06}Cu_{0.94}$ | $Ce_{0.99}Ta_{0.00}Co_{3.70}Cu_{1.30}$ | $Ce_{0.86}Ta_{0.06}Co_{3.72}Fe_{0.73}Cu_{0.62}$ |
| refined composition | $Ce_{0.98}Ta_{0.04}Co_{4.25}Cu_{0.75}$ | $Ce_{0.99}Ta_{0.02}Co_{3.79}Cu_{1.21}$ | $Ce_{0.86}Ta_{0.12}Co_{3.68}Fe_{0.72}Cu_{0.60}$ |
| formula mass | 442.68 | 442.57 | 449.52 |
| space group; Z | P6/mmm; 1 | P6/mmm; 1 | P6/mmm; 1 |
| a (Å) | 4.946(1) | 4.952(1) | 4.928(1) |
| c (Å) | 4.038(1) | 4.035(1) | 4.073(1) |
| V (Å$^3$) | 85.57(4) | 85.70(5) | 85.66(2) |
| $d_c$ (Mg/m$^3$) | 8.52 | 8.57 | 8.69 |
| μ (mm$^{-1}$; Mo Kα) abs coef | 37.85 | 37.08 | 39.78 |
| reflns collected/$R_{int}$ | 1631/0.025 | 2002/0.042 | 1808/0.027 |
| ind. data/restrains/params | 79/0/12 | 109/0/13 | 91/0/11 |
| GoF (F$^2$) | 1.221 | 1.129 | 1.172 |
| R1/wR2 [I > 2σ(I)] | 0.018/0.041 | 0.021/0.048 | 0.030/0.063 |
| R1/wR2 [all data] | 0.021/0.041 | 0.025/0.046 | 0.031/0.063 |
| Largest diff peak/hole (e/Å$^3$) | 0.80/−0.74 | 1.04/−0.99 | 1.91/−1.53 |

TABLE 7

Atomic coordinates, Equivalent Isotropic Displacement Parameters (Å × 103), and Site Occupancy Factors Refined for III - $Ce_{15.7}Ta_{0.6}Co_{67.8}Cu_{15.9}$, IV - $Ce_{16.3}Ta_{0.3}Co_{61.7}Cu_{21.7}$, V - $Ce_{14.3}Ta_{1.0}Co_{62.0}Fe_{12.3}Cu_{10.4}$.

| atom | WP | X | Y | z | $U_{eq}$ | SOF | # |
| --- | --- | --- | --- | --- | --- | --- | --- |
| Ce | 1a | 0 | 0 | 0 | 15(1) | 0.977(2) | III |
|  |  |  |  |  | 16(1) | 0.988(2) | IV |
|  |  |  |  |  | 19(1) | 0.936(3) | V |
| Ta | 2e | 0 | 0 | 0.280(6) | 15(1) | 0.023(2) | III |
|  |  |  |  | 0.296(9) | 16(1) | 0.012(1) | IV |
|  |  |  |  | 0.292(4) | 19(1) | 0.064(3) | V |
| M1$^a$ | 2c | 2/3 | 1/3 | 0 | 14(1) | 1.00 Co | III |
|  |  |  |  |  | 15(1) | 0.23(7) Cu | IV |
|  |  |  |  |  | 23(1) | 1.00 Co | V |
| M2 | 3g | 1/2 | 0 | 1/2 | 10(1) | 0.25(6) Cu | III |
|  |  |  |  |  | 10(1) | 0.25(5) Cu | IV |
|  |  |  |  |  | 10(1) | 0.24 Fe/0.20 Cu | V |

$^a$The atomic symbol "M" stands for Co/Cu or Co/Fe/Cu mixed occupancy; 3g occupancy for sample V have been fixed.

FIG. 14a is a high angle annular backfield (HAADF) scanning transmission electron microscope (STEM) image of as-grown sample III—$Ce_{15.7}Ta_{0.6}Co_{67.8}Cu_{15.9}$ showing the overall microstructure. The entire region consists of a single crystalline phase. FIG. 14b is an enlarged HAADF image which shows a dark-contrast line, which was the only feature which could be found in the entire scan area. FIG. 14c is a diffraction pattern taken from the region shown in FIG. 14b including the matrix and the dark line. It clearly shows the single crystalline 1:5 phase. It seems that the dark line region has the same crystal structure and it is not a precipitate which would have made additional diffraction spots in FIG. 14c. FIG. 14d is a high resolution STEM image taken from left boxed area in FIG. 14b under [1-10] zone axis. The bright spots and the dark spots in the images correspond to atomic columns of Ce and Co/Cu elements, respectively. The inset at bottom right is an enlarged atomic image with atomic model of hexagonal 1:5 Ce/Co/Cu phase. The bright dots and dark dots in the images correspond to atomic columns of Ce and (Co, Cu) elements, respectively. FIG. 14e is an enlarged image of right boxed area in FIG. 14b and the dark line in the single crystalline phase is shown clearly. FIG. 14f shows EDS elemental mapping of FIG. 14e. The chemical contrast between the matrix and the dark line is present. The EDS result shows the dark line is Co-enriched and Cu deficient. The small Co and Cu elemental maps (insets in FIG. 14f Co are presented for contrasting observation of Cu depletion in the same dark line.

FIG. 15a is a HAADF image of an annealed sample showing the overall microstructure. Many bright areas were observed unlike the un-annealed sample shown before in FIG. 14a-14b. FIG. 15b is an enlarged image of the circled area in FIG. 15a. FIG. 15c is the EDS elemental mapping corresponding to FIG. 15b. The bright regions in FIG. 15b are Ta-rich and considered as Ta precipitates. Additionally, a few dark lines are observed in the Ta precipitate. The difference in brightness of precipitates is attributed to the difference in the thickness of each precipitate. FIG. 15d is an enlarged image of the boxed area in FIG. 15b, and FIG. 15e is a diffraction pattern taken from FIG. 15d including the matrix and the Ta-containing precipitates. FIG. 15d shows Ta precipitates coherently embedded by epitaxial precipitation and the corresponding diffraction pattern shows the epitaxial relationship between the matrix and Ta precipitate. The orientation relation was observed as follows: (110) Ce—CoCu//(110) Ta; (002) CeCoCu//(1-10) Ta; and [1-10] CeCoCu//[001] Ta. FIG. 15f is a high resolution STEM image taken from the matrix in FIG. 15d under [1-10] zone axis. It is the same as that seen in FIG. 14d. The inset at bottom right is an enlarged atomic image with an atomic model of hexagonal 1:5 Ce/Co/Cu phase. The bright dots and dark dots in the images correspond to atomic columns of Ce and Co/Cu elements, respectively.

FIGS. 16a-16f show high resolution HAADF images of the interface between the matrix and the Ta precipitate taken from right-hand-boxed area in FIG. 15b and corresponding EDS elemental mapping results [FIG. 16b-16f]. The white dashed lines indicate the same position in each image. Although Cu-rich and Co-deficient region was observed near the precipitate, there was also Co, Ce-rich and Cu-deficient interface between the matrix and the Ta precipitate. The dark lines in the Ta precipitate turned out to be Co-rich. Considering EDS maps at the interface and near the precipitate, Co possibly infiltrated into the precipitate [FIG. 15d], and Co became deficient near the precipitate with relative Cu-enrichment as a result, although the inventors do not intend or wish to be bound by any theory in this regard.

Figure 17:
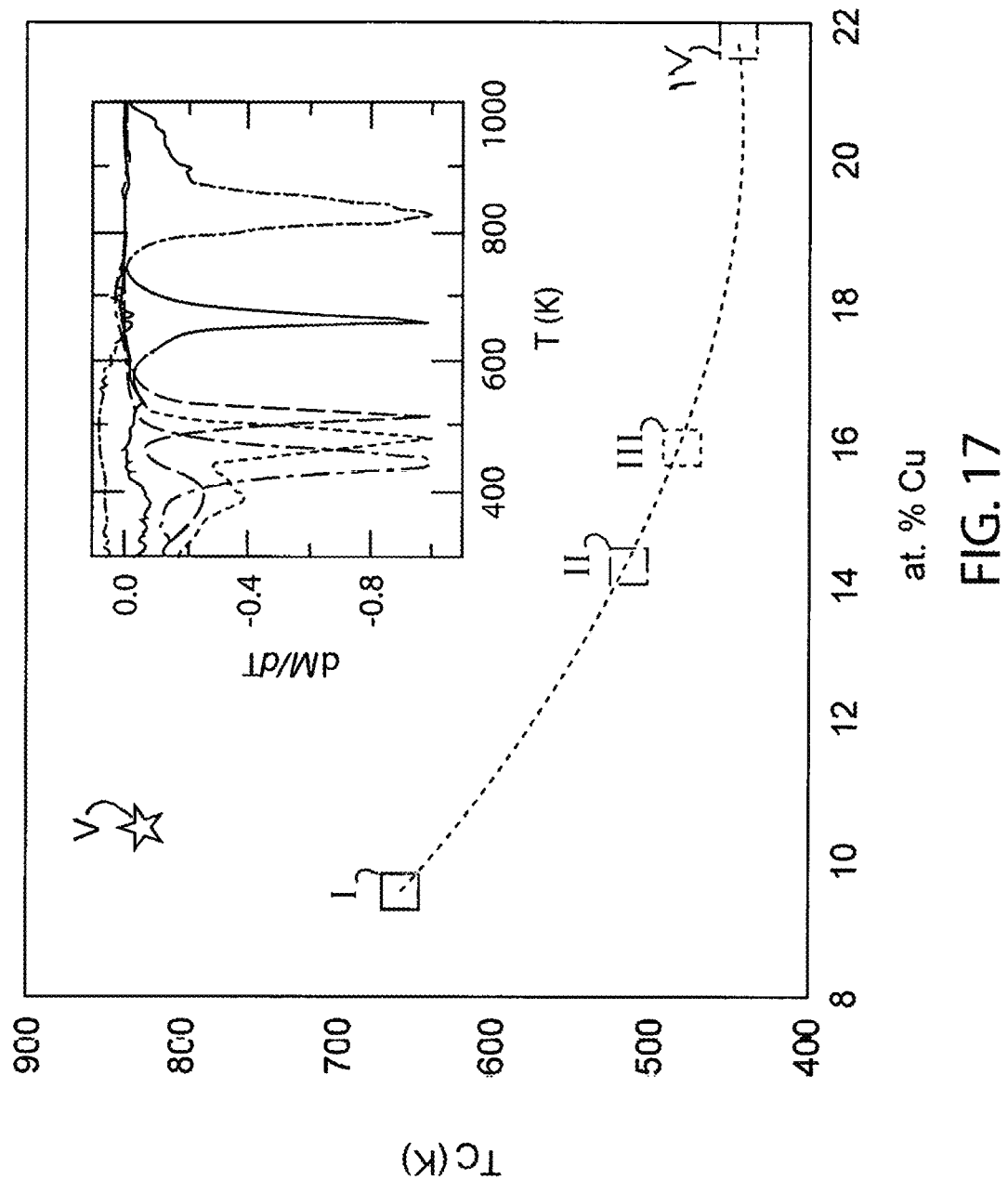
FIG. 17 shows Curie temperatures for the as-grown samples I, II, III, IV, and V inferred from the peaks in derivative of magnetization with respect to temperature; i.e. dM/dT obtained for each crystal sample I-V. Magnetization data were obtained under magnetic field of 0.01 T.
Figure 18:
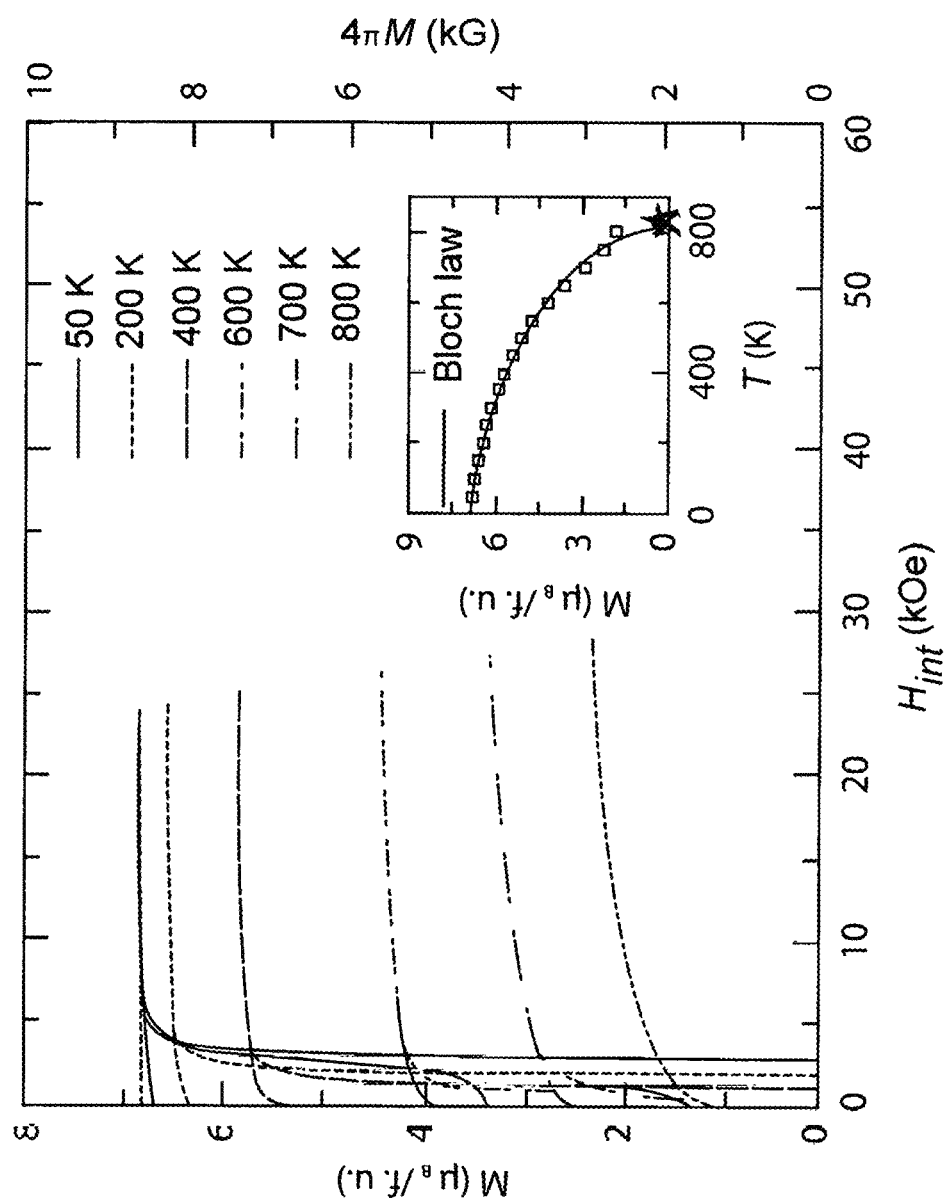
FIG. 18 shows representative M(H) isotherms for the as-grown crystal sample V. In the inset, spontaneous magneetizations for each temperature inferred from the extrapolation of the linear regions of M(H) back to H=0. Star shows extrapolated $T_c$ value following the Bloch law: $M(T)=M(0)(1-(T/T_c)^{3/2})$.

Magnetic Properties:

Curie temperature, magnetocrystalline anisotropy field, and energy density of as-grown crystals: FIG. 17 presents the Curie temperatures for samples I-V as inferred from the peak in dM/dT shown in the inset. The Curie temperatures $T_c$ estimated by the minimum in the derivative correspond closely to the $T_c$ derived via the more accurate Arrot plot method (see below). The $T_c$-value decreases rapidly with increasing Cu content for Fe-free samples I-IV. This indicates weakening in the ferromagnetic exchange interactions within the Co sublattice due to the introduction of nonmagnetic Cu. In contrast, the Fe-doped crystal sample V shows remarkable improvement of $T_c$, increasing by over 150 K to 820 K, a value that is significantly higher than the $T_c$=653 K of the parent $CeCo_5$. Band structure analysis indicates that Fe— doping of $CeCo_5$ and $Ce(Co,Cu)_5$ increases the ordering energy $\Delta E = E_{NM} \, E_{F \, M}$ (NM=non-magnetic and FM=ferromagnetic states), as well as the total magnetic moment of the systems. This leads to the remarkable increase of the Curie temperature and saturation magnetization.

To more formally determine $T_c$, an Arrot plot analysis was conducted for sample III using isotherms between 460 K and 500 K. The Curie temperature for sample III was estimated to be 480 K, since the isotherm at that temperature was closest to a straight line and passes through the origin. FIG. 17 shows representative M(H) for each H=0. As can be seen, these data suggest a $T_c$ 820 K (estimated by generalized Bloch law fitting of spontaneous magnetization), in good agreement with FIG. 16.

The magnetocrystalline anisotropy field, $H_a$, at room temperature was determined for all as-grown crystal samples I-V. The low temperature estimations of H, were conducted for crystal sample III and V. The anisotropy field was estimated by the high-field, linear extrapolation of the filed-dependent moment along the easy axis [001] and hard (H⊥ [001]) axis (see E. A. Nesbitt et al. "Intrinsic magnetic properties and mechanism of magnetization of Co—Fe—Cu—R permanent magnets," in *AIP Conference Proceedings* (AIP 1973) and Tej N. Lamichhane et al., "$Ce_{3-x}Mg_xCo_9$: Transformation of a Pauli paramagnet into a strong permanent magnet," Physical Review Applied 9 (2018)).

The room temperature $H_a$ for the Fe-free, as-grown crystal samples I-IV exhibit a maximum anisotropy field of about 118 kOe (in crystal sample II). The addition of Fe showed a detrimental influence on the magnetocrystalline anisotropy, (e.g. in Fe-doped sample V, the anisotropy field dropped to about 65 kOe), but the spontaneous magnetization increased by about 30% compared to crystal samples with similar Cu contents. Low temperature measurements estimate the spontaneous magnetization for crystal samples III and V to be about 3.7 and about 6.8$\mu_B$/f.u., respectively.

Figure 19:
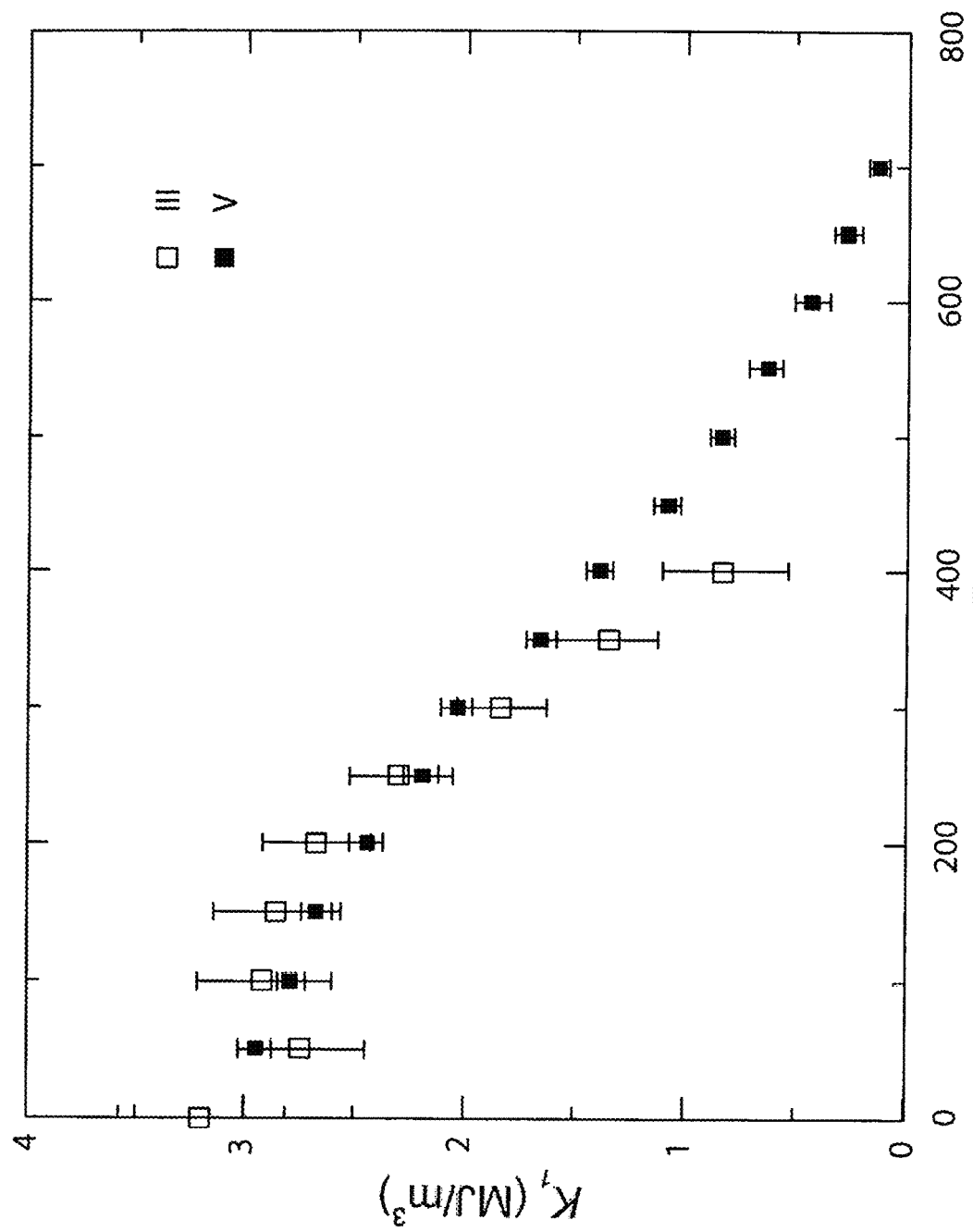
FIG. 19 shows a comparison of temperature dependent magnetocrystalline anisotropy energy density of sample III—$Ce_{15.7}Ta_{0.6}Co_{67.8}Cu_{15.9}$ and sample V—$Ce_{14.3}Ta_{1.0}Co_{62.0}Fe_{12.3}Cu_{10.4}$.

The temperature dependent magnetocrystalline anisotropy energy density was measured using the Sucksmith-Thompson method by using the hard axis magnetization isotherms for crystal samples III and V magnetization isotherms for crystals samples III and V [FIG. 19]. For a description of the Sucksmith-Thompson method, see Tej N. Lamichhane et al., "$Ce_{3-x}Mg_xCo_9$: Transformation of a pauli paramagnet into a strong permanent magnet," Physical Review Applied 9 (2018); W. Sucksmith and J. E. Thompson, "The magnetic anisotropy of cobalt," Proceedings of the Royal Society of London A: Mathematical, Physical and Engineering Sciences 225, 362-375 (1954), and Valentin Taufour et al., "Structural and Ferromagnetic Properties of an Orthorhombic Phase of MnBi Stabilized with Rh Additions," Phys. Rev. Applied 4, 014021 (2015).

Figure 20:
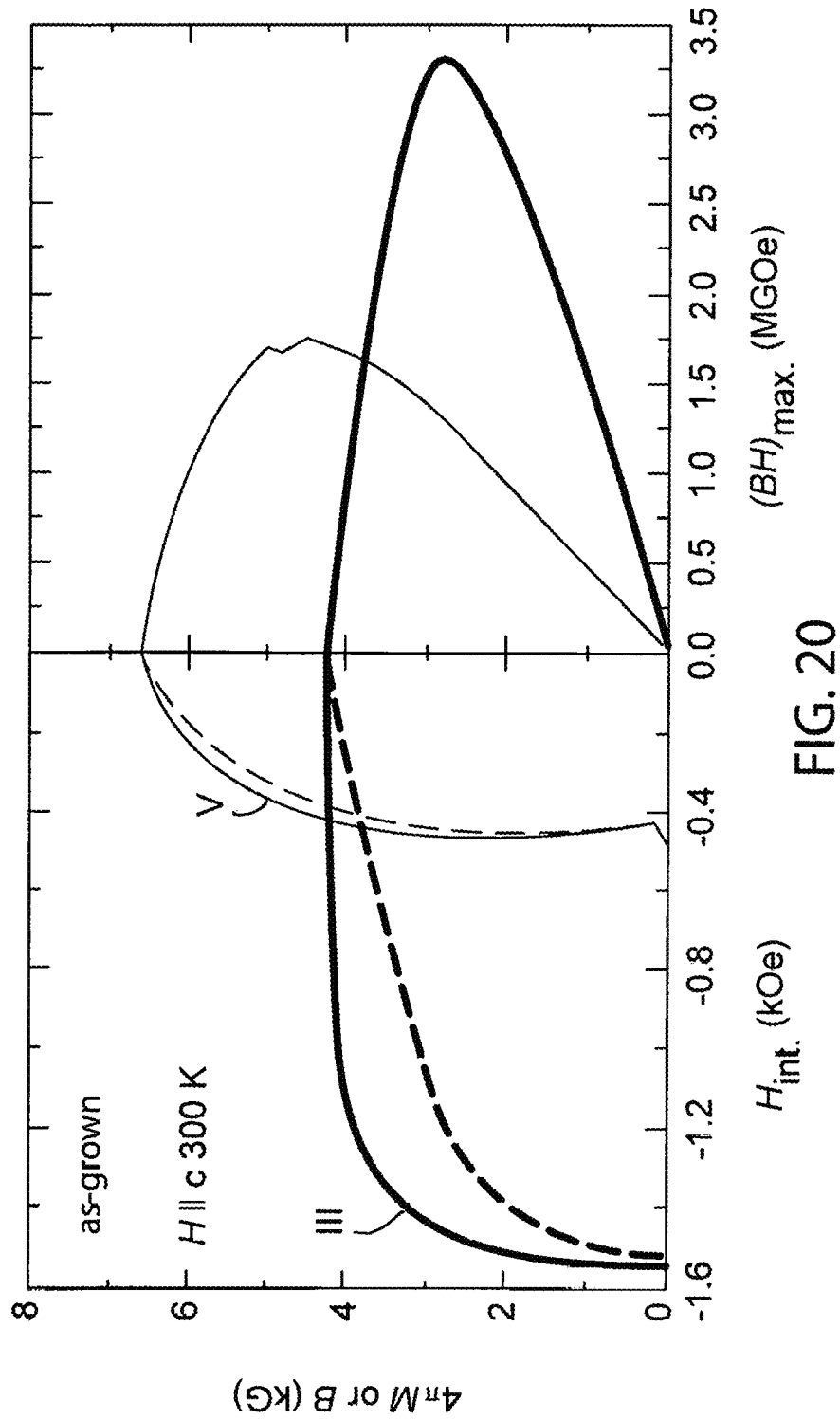
FIG. 20 shows room temperature second quadrant magnetic hysteresis loops for the as-grown crystals sample III—$Ce_{15.7}Ta_{0.6}Co_{67.8}Cu_{15.9}$ and sample V—$Ce_{14.3}Ta_{1.0}Co_{62.0}Fe_{12.3}Cu_{10.4}$ where 4πM is indicated as solid line and B as a dashed line in the left panel. Estimation of the energy products $(BH)_{max.}$ is shown in the right panel.

Interestingly, the as-grown crystals showed magnetic hysteresis when measured along the easy axis of magnetization [001]. For example, crystal sample III exhibited a hysteresis, which reached $H_c \approx 1.6$ kOe and $B_r \approx 4.2$ kG, $M_s \approx 4.2$ kG and $(BH)_{max} \approx 3.5$ MGOe [FIG. 20], which is comparable to most of the anisotropic sintered alnico grades. This is remarkable considering the common belief that the appearance of the coercivity is a result of the extrinsic properties, e.g., development of proper microstructure for strong magnetic domain pinning, and this is generally not associated with a single phase single crystal as determined by the SEM examinations [FIGS. 13a-13b] and XRD examinations, which did not reveal any elemental precipitations, segregations, or any microstructure on their corresponding length-scales.

The detailed high resolution STEM examination of the as-grown sample III [FIG. 14a-14c] showed the basic uniformity and integrity with small Co-enriched and Cu depleted regions/stripes coherently dispersed throughout the matrix. Unfortunately, the size of these stripes did not allow for EDS composition determination or structural analysis. These stripes may be embryonic structural defects caused by stacking faults compensating for various channel disorders within the material and/or the nucleation sites for the decomposition and/or miscibility gap, although the inventors do not intend or wish to be bound by any theory in this regard.

Figure 21:
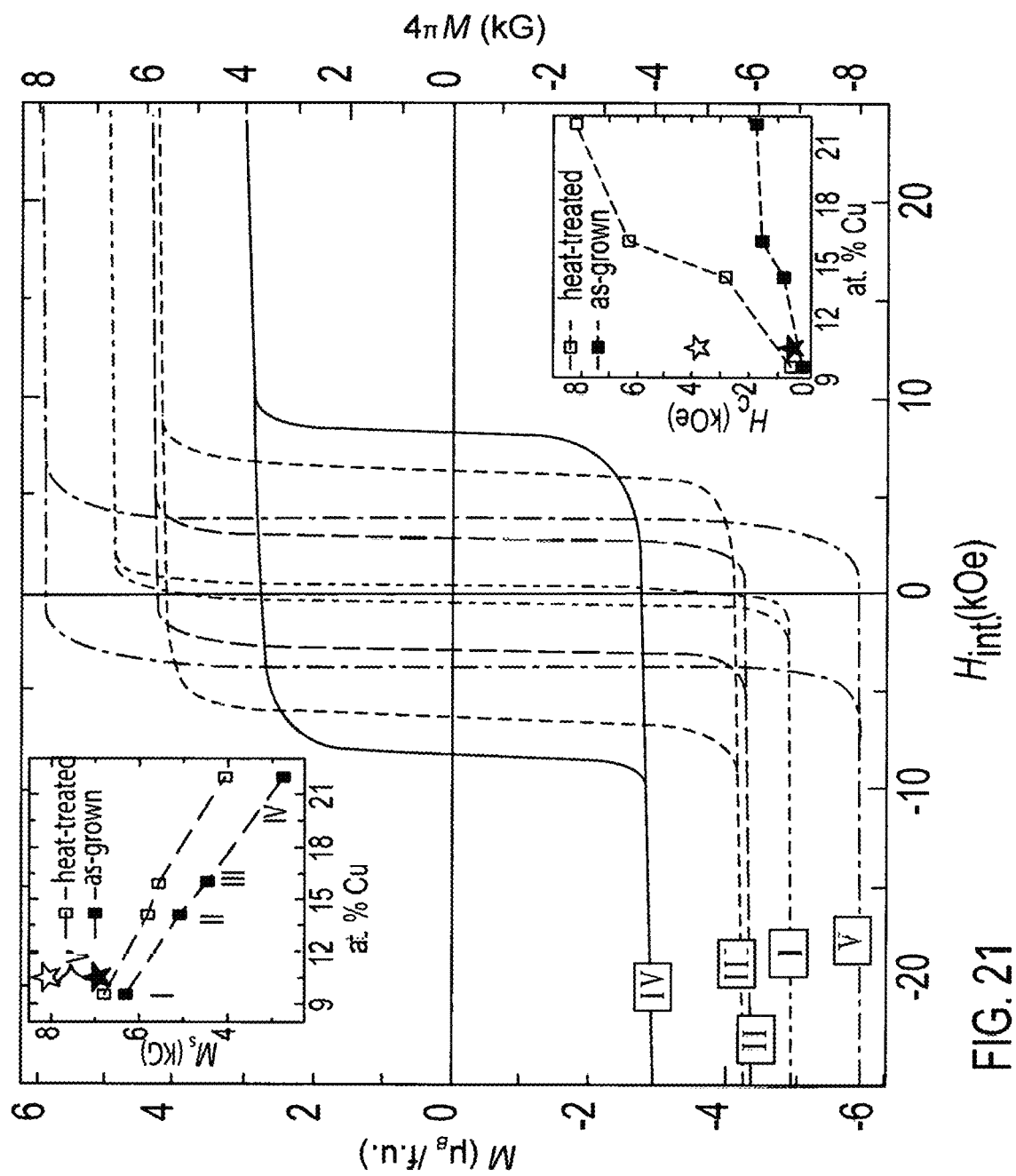
FIG. 21 shows magnetic hysteresis loops of the heat-treated crystal samples I—$Ce_{15.1}Ta_{1.0}Co_{74.4}Cu_{9.5}$, sample II—$Ce_{16.3}Ta_{0.6}Co_{68.9}Cu_{14.2}$, sample III—$Ce_{15.7}Ta_{0.6}Co_{67.8}Cu_{15.9}$, sample IV—$Ce_{16.3}Ta_{0.3}Co_{61.7}Cu_{21.7}$, and sample V—$Ce_{14.3}Ta_{1.0}Co_{62.0}Fe_{12.3}Cu_{10.4}$ at 300 K.
Figure 22:
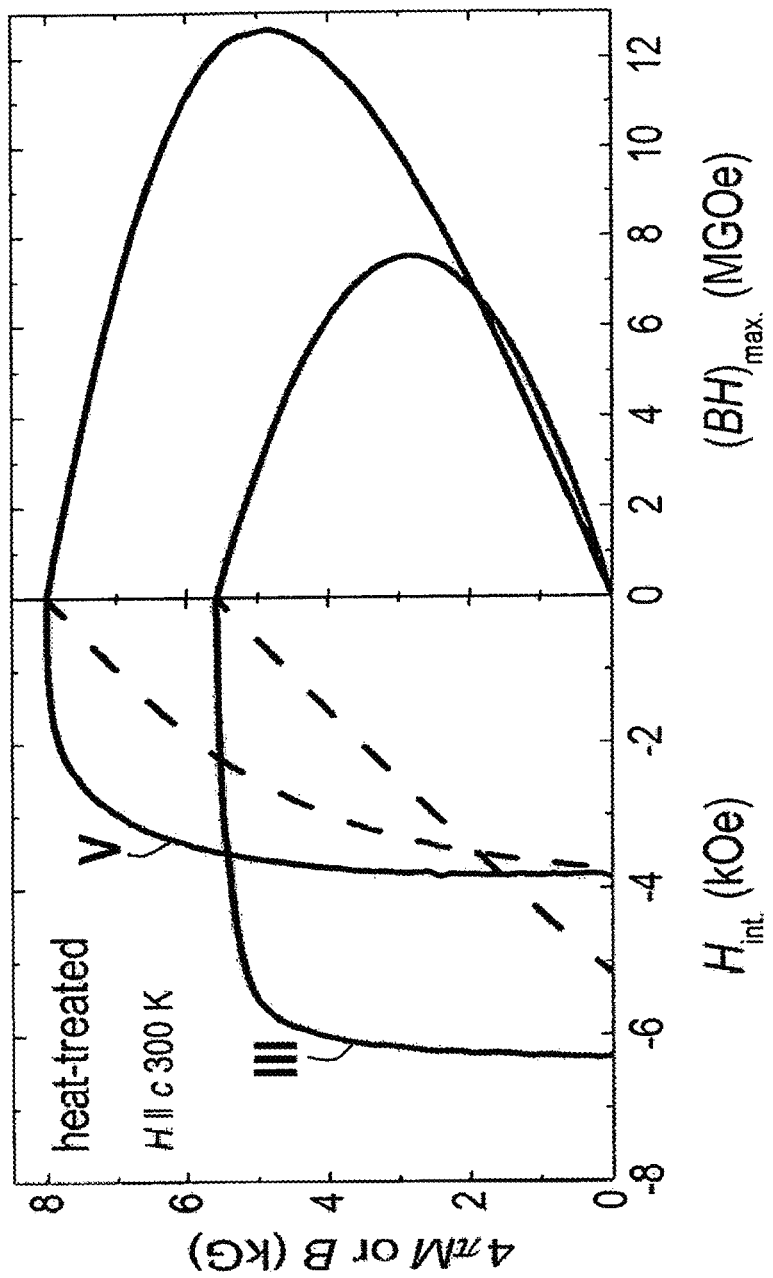
FIG. 22 shows room temperature second quadrant magnetic hysteresis loops for the heat-treated crystal sample III—$Ce_{15.7}Ta_{0.6}Co_{67.8}Cu_{15.9}$ and sample V—$Ce_{14.3}Ta_{1.0}Co_{62.0}Fe_{12.3}Cu_{10.4}$ where 4πM is indicated as solid line and B as a dashed line in the left panel. Estimation of the energy products (BH)max. is shown in the right panel.

Heat Treated Crystals—Coercivity, Pinning, and Magnetic Energy:

After heat treatment, crystal samples I-V showed significantly increased magnetic hystereses with a monotonic increase of coercivity, $H_c$, and a linear decrease of spontaneous magnetization $M_s$ with increasing Cu content [FIG. 21]. For example, the magnetic characteristics of sample III change as follows: significant increase of $H_c$ from ~1.6 to ~6.3 kOe with an increase of $B_r$ ($M_s$) from ~4.2 (4.2) to ~5.3 (5.7) kG, resulting in $(BH)_{max}$ of ~7.8 MGOe [FIG. 22]. In addition to the conspicuous increase in magnetic hysteresis, there is a noteworthy increase in saturated magnetization of the heat-treated samples [FIG. 21, upper inset].

Referring back to EXAMPLE #3 (crystal V) to this same end, EXAMPLE 3#showed significant improvement of magnetic energy characteristics reaching $(BH)_{max}$ of about 13 MGOe, FIGS. 11a, 11b. Fe thus strongly improved both the Curie temperature (to about 820 K) and the magnetization (to about 8 kG) of the heat-treated magnetic material resulting in magnetic energy of about 13 MGOc at room temperature.

The increases in magnetic properties after the heat treatment correlate with the appearance of the Ta-rich precipitates [see SEM images above, FIG. 13a-13c]. The STEM analysis confirmed that these are 90-95% pure rectangular blocks of Ta (according to diffraction patterns and elemental analysis), and their interfaces were coherent with the matrix material. However, high magnification TEM EDS maps [FIG. 14c, FIG. 16a-16f] observed a Cu-deficient and Co-enriched layer at the interface of the precipitates and the matrix, and Co was detected in precipitates as lines, which somewhat resemble observations of rare Co-enriched and Cu-depleted lines in the as-grown STEM examination [FIG. 14a-14f].

These results suggest that the high coercivity may be explained by the Ta-rich precipitates serving as pinning sites and can be described using a simple domain pinning model. Typically, the coercive force is inversely proportional to the saturation magnetization for a particular magnetocrystalline energy ($H_c$=AK/$M_s$l, where A—exchange constant, K—magnetocrystalline anisotropy, $M_s$—saturation magnetization and l—the distance between the precipitates. According to the equation, by increasing the amount of pinning precipitates the volume fraction of the matrix material and magnetization $M_s$ of the system is decreased. Also the distances l between the precipitates become shorter. As a result, the coercivity $H_c$ increases. Thus, the $H_c$ of the sample crystals should be directly proportional to the Ta content. However, the inventors observed the inverse proportionality: total Ta content monotonically decreases in crystals samples I through IV [Table 1], whereas the coercivity monotonically increased [FIG. 20].

In contrast, the $H_c$ increase correlated directly with increasing Cu content [FIG. 21, see both insets], also following the proposed precipitation coercivity mechanism (see equation above). Pinning of magnetic domains should occur on the precipitates, the amount of which is regulated by Cu, rather than Ta content. However, precipitates that are clearly associated with Cu were not observed in the samples, except Cu-depleted regions observed in STEM experiments [FIG. 14c, FIG. 16a-16f].

Although the inventors do not wish or intend to be bound by any theory, the Ta-rich laminar precipitates therefore may be considered as a secondary effect, which are believed to decorate the extended 3D defects and structural imperfections that originate from Cu depleted and Co enriched lines observed in the as-grown crystals [FIG. 16a-16f] and consequently develop into the regions between Ta-rich precipitates and matrix in the thermally aged crystals [FIG. 14c, FIG. 16a-16f]. The amount of these imperfections appear to increase with increasing Cu content and lead to increased coercivity.

The examples described above thus demonstrate the synthesis of five different single crystals of Ta, Cu and/or Fe substituted CeCo$_5$ using the self-flux technique. The results can be summarized as Indicating that the crystals so produced retained a CaCu$_5$ substructure and incorporate small amounts of Ta in the form of "dumb-bells" filling the 2e crystallographic sites within the 1D hexagonal channel with the 1a Ce site, whereas Co, Cu and Fe are statistically distributed among the 2c and 3g crystallographic sites. The as-grown crystals appeared to be single phased and homogenous in composition. Their single crystallinity is confirmed by XRD, SEM and TEM experiments. However they also exhibit significant magnetic coercivities, which are comparable to most anisotropic sintered alnico grades. After the heat treatment (hardening), magnetic characteristics significantly improve. Ta atoms appear to leave the matrix interstices of the as-grown crystals and precipitate in the form of coherent laminas creating the so-called "COMPOSITE CRYSTAL". The "COMPOSITE CRYSTAL", formed during the heat treatment, appears to contain a 3D array of structural defects within a primarily single grain single crystal, although the inventors do not wish or intend to be bound by the proposed explanation above.

To this same end, the mechanism of coercivity appears to be regulated by Cu, and pinning occurs on the extended 3D defects and structural imperfections that originate from Cu depleted and Co enriched lines observed in the as-grown crystals and consequently develop into the regions between Ta-rich precipitates and matrix in the thermally aged crystals. The structural defects form as a result of a thermodynamic transformation of the matrix material associated with its partial decomposition and/or decreased miscibility during hardening process. Significant improvement of magnetization in the heat-treated samples may be associated either with the transformation of the matrix phase or with the removal of Ta from the matrix. Fe strongly improves both the Curie temperature and magnetization of the system, which is associated with a strong increase in the magnetic ordering energy. The peculiar thermodynamic transformations, which lead to intragranular pinning and a unique coercivity mechanism that does not require the typical processing for the development of extrinsic magnetic properties, could be used to create permanent mag-nets with lowered processing costs. Further composition—temperature—time optimizations may result in a critical material free and cost-efficient gap magnet with energy product above 7 to about 15 MGOe and even up to about 16.5 MGOe.

The present invention is advantageous to provide for substitution of Sm fully by less expensive Ce in a 1:5-type magnet together with small additions of Ta to provide magnetic characteristics suitable for the "GAP MAGNET" at significantly lower material costs. Moreover, use of grain development techniques is not strongly required for development of significant coercivities, making permanent magnets pursuant to the present invention also a process efficient material.

Although the present invention has been described with respect to certain illustrative embodiments, those skilled in the art will appreciate that the invention is not limited to these embodiments and that changes and modifications can be made therein within the scope of the invention as set forth in the appended claims.

We claim:

1. A permanent magnet alloy casting, comprising Ce, Co, Cu, and a refractory metal having a heat treated cast microstructure containing refractory metal-containing laminas dispersed and coherently precipitated within a single grain matrix or within individual grains of a multi-grain alloy matrix wherein the laminas follow hexagonal crystal symmetry within the single grain or within the individual grains and have respective lengths of about 1 micron to 10 microns and respective thicknesses of about 0.05 micron to 0.1 micron, whereby the microstructure imparts to said alloy casting magnetic properties for use as a permanent magnet.

2. The alloy casting of claim 1 wherein the refractory metal comprises Ta.

3. The alloy casting of claim 1 wherein the refractory metal comprises at least one of Ta and Hf.

4. The alloy casting of claim 1 wherein the refractory metal comprises at least one of Ta, Hf, Zr, Nb, Mo, and W present in an individual or collective amount of at least 0.1 atomic % up to about 3 atomic %.

5. The alloy casting of claim 1 wherein Fe is substituted partly for Co.

6. The alloy casting of claim 1 which has a CeCo$_5$ crystal structure.

7. The alloy casting of claim 1 having Cu-enriched regions and Co-depleted regions near respective laminas.

8. The permanent magnet alloy casting of claim 1, comprising, in atomic %, 13% to 16.6% Ce, 38% to less than 70% Co, 10% to 30 atomic % Cu, 10% to 20% Fe, and a refractory metal in an individual or collective amount greater than 0.1% up to 3% atomic %.

9. The alloy casting of claim 8 which is heat treated as solidified bulk ingot casting to develop a bimodal microstructure having refractory metal-containing laminas in a primarily single crystal alloy matrix or a polycrystalline alloy matrix.

10. The alloy casting of claim 9 having Cu-enriched regions and Co-depleted regions near respective laminas.

11. The alloy casting of claim 8 comprising, in atomic %, 14% to 15.5% Ce, 57.5% to 62.0% Co, 10% to 16.5% Cu, 10% to 12.5% Fe, and one or more refractory metals in an individual or collective amount of 0.5% to 1% atomic %.

12. The alloy casting of claim 8 comprising, in atomic %, 13% to 15.5% Ce, 57.5% to 62.0% Co, 10% to 16.5% Cu, 10% to 13.7% Fe, and one or more refractory metals in an individual or collective amount of 0.5% to 1.3% atomic %.

13. The alloy casting of claim 1 which is subjected to a solution temperature followed by aging to develop a bimodal microstructure.

14. The alloy casting of claim 1 which exhibits magnetic characteristics acceptable for a "GAP MAGNET" wherein the alloy exhibits a $T_c > 300°$ C., $H_c = 0.5$—$1.0$ T, $B_r = 4$—$9$ kG and $(BH)_{max} = 7$—$15$ MGOe.

15. A method of making the permanent magnet alloy casting of claim 1, comprising heat treating the permanent magnet alloy casting comprising Ce, Co, Cu, and a refractory metal comprising at least one of Ta, Hf, Zr, Nb, Mo, and W to develop a bimodal microstructure having refractory metal-containing laminas in a matrix microstructure.

16. The method of claim 15 wherein the alloy casting comprises, in atomic %, about 13 to about 17% Ce, about 38 to about 70% Co, about 10% to about 30 atomic % Cu, optionally about 10% to about 20% Fe, and one or more refractory metals in an individual or collective amount greater than 0.1 up to about 3 atomic %.

17. The method of claim 16 wherein heat treating involves heating the alloy casting to a solution temperature followed by aging to develop the bimodal microstructure.

18. The method of claim 17 wherein the solution temperature is 1000-1100° C. for a time followed by aging at 400-450° C. for for a time to develop the bimodal microstructure.

* * * * *